United States Patent
Kaneko et al.

(10) Patent No.: US 8,629,405 B2
(45) Date of Patent: Jan. 14, 2014

(54) RADIOLOGICAL IMAGE DETECTION APPARATUS AND METHOD FOR MANUFACTURING THE SAME

(75) Inventors: Yasuhisa Kaneko, Kanagawa (JP); Haruyasu Nakatsugawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 194 days.

(21) Appl. No.: 13/338,991

(22) Filed: Dec. 28, 2011

(65) Prior Publication Data

US 2012/0193543 A1 Aug. 2, 2012

(30) Foreign Application Priority Data

Jan. 31, 2011 (JP) ................. 2011-019325

(51) Int. Cl.
*G01T 1/20* (2006.01)
(52) U.S. Cl.
USPC .... 250/367; 250/361 R; 250/369; 250/370.11
(58) Field of Classification Search
USPC ........................................ 250/369
See application file for complete search history.

(56) References Cited

U.S. PATENT DOCUMENTS

| 4,398,092 A * | 8/1983 | Carlson ................. 250/361 R |
| 4,820,926 A * | 4/1989 | Popma et al. .............. 250/486.1 |
| 2007/0205371 A1* | 9/2007 | Inoue ...................... 250/370.11 |
| 2008/0083877 A1 | 4/2008 | Nomura et al. |
| 2010/0117006 A1* | 5/2010 | Sawamoto et al. ........ 250/484.4 |
| 2010/0144082 A1* | 6/2010 | Inoue ............................ 438/59 |
| 2011/0006213 A1 | 1/2011 | Sato et al. |

FOREIGN PATENT DOCUMENTS

| JP | 2006-064436 A | 3/2006 |
| JP | 2008-051793 A | 3/2008 |
| JP | 2011-017683 A | 1/2011 |

* cited by examiner

*Primary Examiner* — Marcus Taningco
(74) *Attorney, Agent, or Firm* — Studebaker & Brackett PC

(57) ABSTRACT

A radiological image detection apparatus includes: a scintillator which is formed out of a group of columnar crystals in which crystals of a fluorescent material emitting fluorescence when irradiated with radiation have grown into columnar shapes; and a photodetector which detects the fluorescence emitted by the scintillator as an electric signal. Activator density in the scintillator varies between high density and low density repeatedly in a radiation travelling direction in at least a part of the scintillator. The activator density in each of front end portions and base end portions of the columnar crystals is lower than the high density.

20 Claims, 13 Drawing Sheets

RADIOLOGICAL IMAGE DETECTION APPARATUS AND METHOD FOR MANUFACTURING THE SAME

CROSS-REFERENCE TO RELATED APPLICATIONS

This application is based on and claims priority under 35 USC 119 from Japanese Patent Application No. 2011-019325 filed on Jan. 31, 2011; the entire content of which is incorporated herein by reference.

BACKGROUND

1. Technical Field

The present invention relates to a radiological image detection apparatus for use in a medical X-ray imaging system etc., and a method for manufacturing the same.

2. Related Art

In recent years, a DR (Digital Radiography) using an X-ray image detection apparatus such as an FPD (Flat Panel Detector) for converting X-rays into digital data has been put to practical use. The X-ray image detection apparatus has been being widely used rapidly due to a merit that an image can be confirmed in real time as compared with a background-art CR (Computed Radiography) system using an imaging plate.

Various systems have been proposed for an X-ray image detection apparatus. For example, there is an indirect conversion system in which X-rays are once converted into visible light by a scintillator of CsI:Tl or GOS ($Gd_2O_2S$:Tb), and the converted light is converted into electric charges by a semiconductor layer and accumulated.

For example, when such an X-ray image detection apparatus is used in a living body, it is often preferable that the dose of X-rays is low. A scintillator which is high in amount of luminescence and superior in sensitivity is therefore desired. Addition of an activator to a host of a fluorescent material is known as a method for increasing the amount of luminescence of a scintillator (Patent Documents 1 (JP-A-2008-51793), Patent Document 2 (JP-A-2006-064436) and Patent Document 3 (JP-A-2011-017683)). In Patent Document 1, description has been made on a radiological image detection apparatus having a sensor board and a scintillator which includes columnar crystals and on which X-rays are incident from the opposite side to the sensor board, wherein: the density of an activator is increased in an X-ray entrance side region of the scintillator. In the description of Patent Document 1, for example, the activator density on a front end side of each of the columnar crystals is high when the columnar crystals are deposited on the sensor board, and the activator density on a base end side of each of the columnar crystals is high when a substrate on which the columnar crystals are deposited is pasted onto the sensor board.

In Patent Document 2, description has been made on a radiological image conversion panel having a photostimulable phosphor in which a layer with a low intensity of luminescence and a layer with a high intensity of luminescence are laminated alternately in the deposition direction of CsBr:Eu.

Here, the amount of luminescence is increased with increase in the activator density. However, the crystallinity of the scintillator is disordered by activation with high density to thereby cause light absorption and light diffusion. Thus, MTF (Modulation Transfer Function) deteriorates.

In addition, in the description of Patent Document 1, the activator density on the base end side of each columnar crystal or the activator density on the front end side of each columnar crystal is increased in accordance with the configuration about the manufacturing and assembly of the scintillator and the sensor board. However, when the activator density is high on the base end side of the columnar crystal which is a portion of an early stage of crystal growth, MTF is lowered due to deterioration of crystallinity. On the other hand, when the activator density is high on the front end side of the columnar crystal, the strength is lowered due to disorder of crystallinity. Thus, the front end portion of each crystal is easily damaged when the scintillator and the sensor board are pasted or when a load is applied to a scintillator panel. Further, when a protective film is broken or separated from the substrate on the base end side or the front end side where the activator density is high, the scintillator absorbs moisture and the performance thereof deteriorates easily.

SUMMARY

An illustrative aspect of the invention is to provide a radiological image detection apparatus and a method for manufacturing the same, in which the amount of luminescence and MTF can be increased satisfactorily, and the strength of crystals and the resistance to moisture absorption can be secured to improve the reliability.

According to an aspect of the invention, a radiological image detection apparatus includes: a scintillator which is formed out of a group of columnar crystals in which crystals of a fluorescent material emitting fluorescence when irradiated with radiation have grown into columnar shapes; and a photodetector which detects the fluorescence emitted by the scintillator as an electric signal. Activator density in the scintillator varies between high density and low density repeatedly in a radiation travelling direction in at least a part of the scintillator. The activator density in each of front end portions and base end portions of the columnar crystals is lower than the high density.

With the radiological image detection apparatus, the activator density at least in a radiation entrance side region of the scintillator is varied repeatedly between high density and low density, and the activator density in each of the front end portions and the base end portions of the columnar crystals is reduced, so as to suppress the disorder of crystallinity. Thus, the amount of luminescence and MTF can be increased satisfactorily and the strength of the crystals can be improved. Further, it is possible to improve the resistance to moisture absorption when a protective film is broken or separated from a substrate.

DETAILED DESCRIPTION

An example of an X-ray image detection apparatus (radiological image detection apparatus) for explaining an embodiment of the invention will be described below with reference to FIGS. 1 to 6.

Constituents similar to those in the aforementioned configuration are referred to by the same numerals correspondingly, and description thereof will be omitted or simplified.

[1. Overall Configuration]

Figure 1:
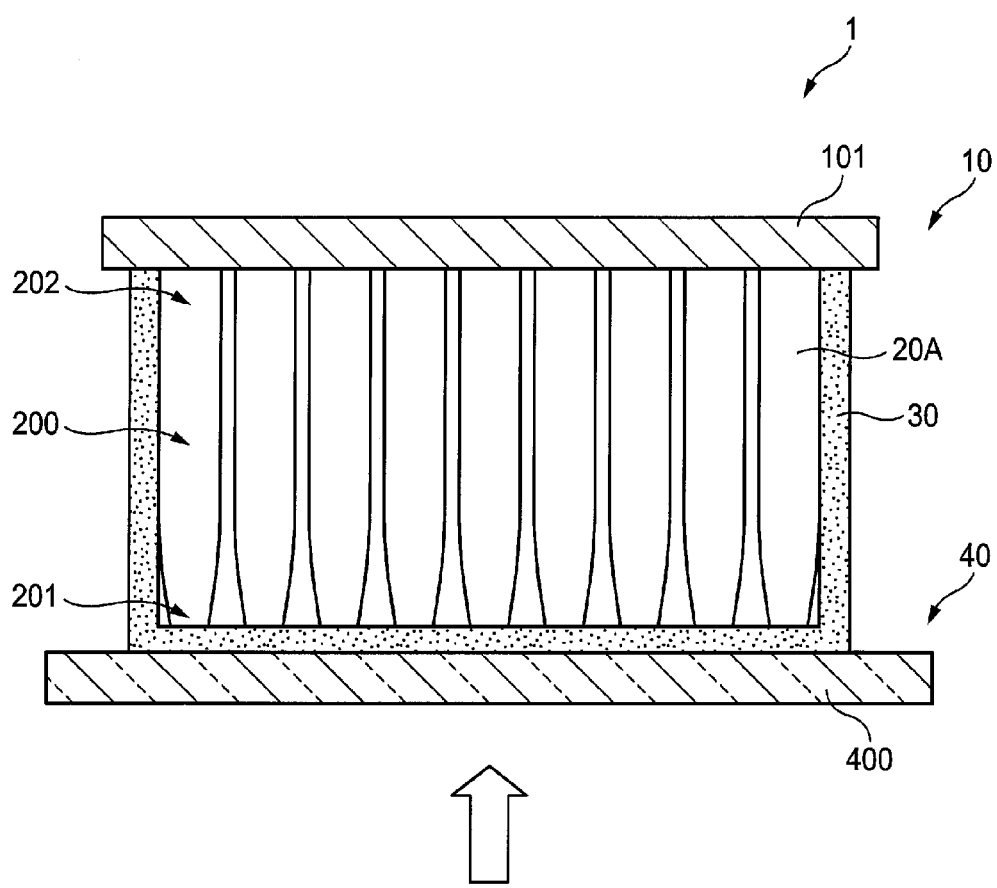
FIG. 1 is a side sectional view schematically showing the outline configuration of an X-ray image detection apparatus.

FIG. 1 is a side sectional view schematically showing the outline configuration of an X-ray image detection apparatus 1 of an indirect conversion system. The X-ray image detection apparatus 1 has a scintillator panel 10 and a photodetector 40. The scintillator panel 10 includes a scintillator 200 which emits light when irradiated with X-rays. The photodetector 40 detects the light emitted from the scintillator 200 as an electric signal.

In the X-ray image detection apparatus 1, X-rays transmitted through a subject are radiated from the photodetector 40 side toward the scintillator panel 10, as indicated by an outline arrow in FIG. 1. When the X-rays enter the scintillator 200 through a sensor board 400 of the photodetector 40, the scintillator 200 absorbs the X-rays to emit light. The light enters each photoelectric conversion element formed in the sensor board 400. Electric charges accumulated in the photoelectric conversion element of the sensor board 400 are outputted as an electric signal.

A not-shown control module is provided on the opposite side to the X-ray entrance side of the scintillator panel 10. The control module has: a circuit board mounted with an IC as a control portion for driving and controlling the sensor board 400, an IC for processing an image signal, etc.; a power supply circuit; and so on. The control module is assembled integrally with the scintillator panel 10 and the photodetector 40.

[2. Configuration of Photodetector]

Figure 2:
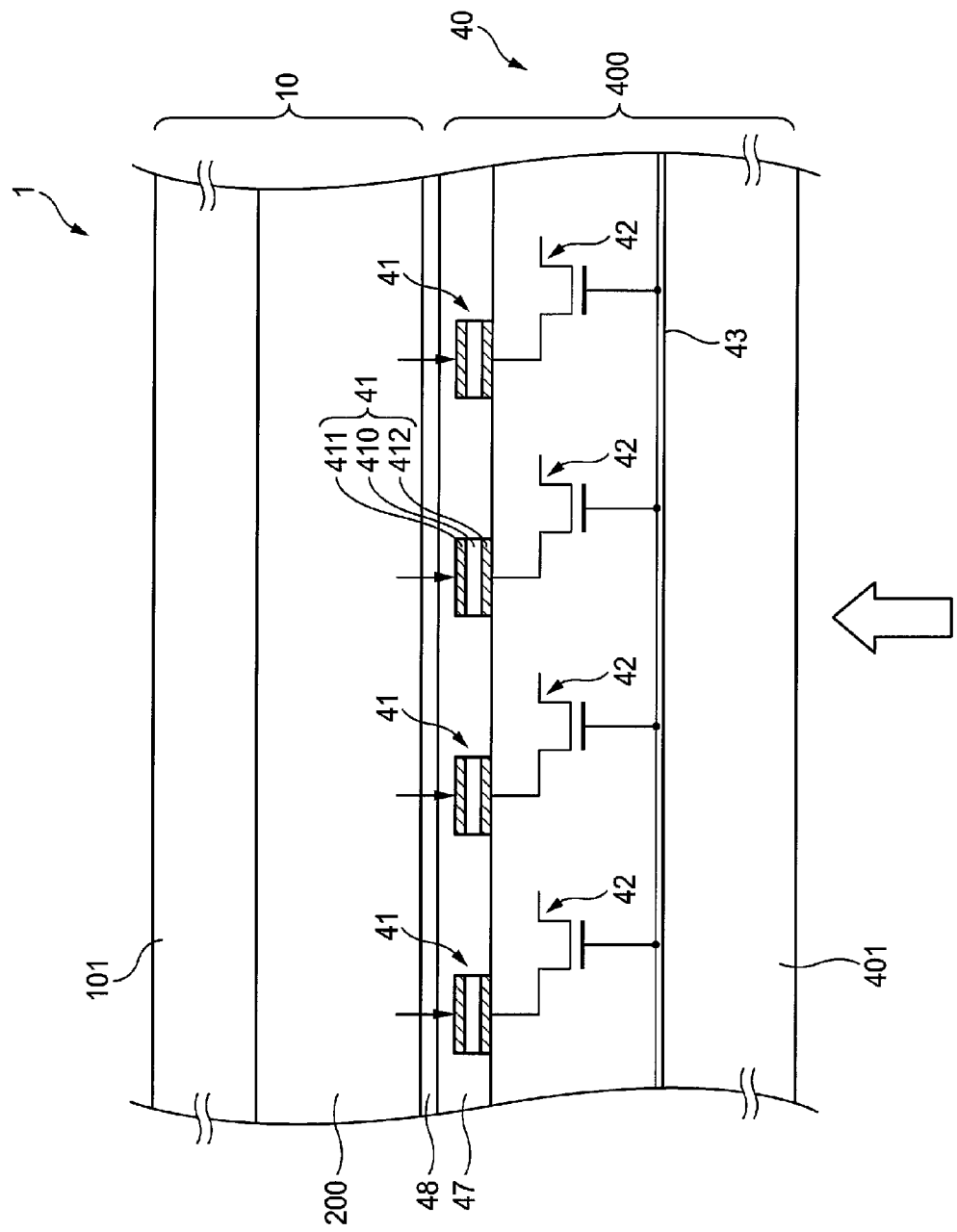
FIG. 2 is a side sectional view schematically showing the outline configuration of a photodetector.
Figure 3:
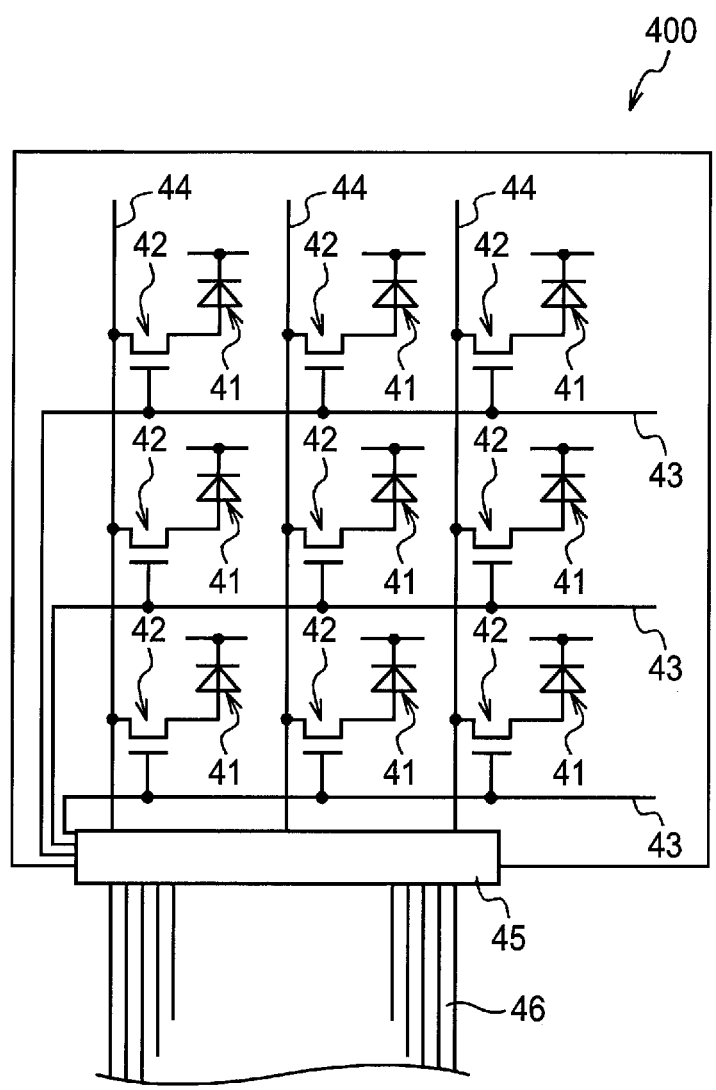
FIG. 3 is a plan view schematically showing a sensor board.

FIG. 2 is a side sectional view schematically showing the configuration of the photodetector 40. FIG. 3 is a plan view schematically showing the configuration of the sensor board 400. The photodetector 40 has a sensor board 400 which is formed into a rectangular shape in plan view. A semiconductor layer is formed in the sensor board 400. The sensor board 400 includes an insulating substrate 401 of glass or the like, photoelectric conversion elements 41 such as a-Si photodiodes, and switching devices 42 such as thin film transistors (TFTs).

For example, a glass substrate, various ceramic substrates or a resin substrate may be used as the insulating substrate 401. The insulating substrate 401 is not limited to these materials.

Each photoelectric conversion element 41 is constituted by a photoconductive layer 410, a bias electrode 411 and a charge collection electrode 412 which are stacked in layers. By the photoconductive layer 410, light (indicated by an outline arrow in FIG. 2) incident on the photoconductive layer 410 from the scintillator 200 of the scintillator panel 10 is converted into electric charges. The bias electrode 411 applies a bias voltage to the photoconductive layer 410. The charge collection electrode 412 collects the electric charges accumulated in the photoconductive layer 410. As shown in FIG. 3, the photoelectric conversion elements 41 are arrayed two-dimensionally, and each photoelectric conversion element 41 corresponds to a pixel of an image to be detected by the photodetector 40.

A switching device 42, a gate line 43 and a data line 44 are provided for each photoelectric conversion element 41, as shown in FIG. 3. Each gate line 43 and each data line 44 are extended to a connection terminal 45, and connected to the circuit board of the control module (FIG. 1) through flexible wires 46 of an anisotropic conductive film or the like, which wires 46 are connected to the connection terminal 45. The switching devices 42 are switched on/off line by line by a control signal transmitted from the control portion mounted in the circuit board through the gate lines 43. Electric charges of the photoelectric conversion elements 41 whose switching devices 42 are switched on are read as an image signal by a signal processing portion of the circuit board through the data lines 44. The electric charges of the photoelectric conversion elements 41 are read sequentially line by line so that a two-dimensional image is detected.

The aforementioned gate lines 43, data lines 44, switching devices 42 and photoelectric conversion elements 41 are formed on a scintillator panel 10 side surface of the insulating substrate 401. Those gate lines 43, data lines 44, switching devices 42 and photoelectric conversion elements 41 are formed sequentially on the insulating substrate 401 by a photo-etching process or the like. In FIG. 2, the surface of the sensor board 400 is flattened by a resin film 47 provided in an outermost layer of the sensor board 400. However, the resin film 47 can be dispensed with. The sensor board 400 and the scintillator panel 10 are pasted to each other through an adhesive layer 48 so that the scintillator 200 adheres to the sensor board 400 through the adhesive layer 48.

The adhesive layer 48 or the resin film 47 between the sensor board 400 and the scintillator panel 10 may be dispensed with. The scintillator panel 10 may be pressed against the surface of the sensor board 400 so as to adhere to the sensor board 400 directly.

Resin forming a resin layer such as a flattening layer, an adhesive layer or a matching oil layer of transparent liquid or gel which is provided between the sensor board 400 and the scintillator panel 10 is not limited particularly as long as the resin allows scintillation light emitted from the scintillator 200 to reach the photodetector 40 without being substantially attenuated.

Polyimide, parylene, etc. may be used as the resin forming the flattening layer. Polyimide with good film-forming properties is preferable.

An adhesive agent which is optically transparent against the scintillation light emitted from the scintillator 200 is preferable as the adhesive agent of the adhesive layer. For example, thermoplastic resin, UV-curable adhesive, heat curing adhesive, room temperature setting adhesive, double-faced adhesive sheet, etc. may be used. In order to prevent the sharpness of an image from being lowered, it is preferable to use an adhesive agent of low-viscosity epoxy resin because the adhesive agent can form a sufficiently thin adhesive layer with respect to the pixel size of the photodetector 40.

In addition, the resin layer such as the flattening layer or the adhesive layer is preferably not thicker than 50 μm, more preferably in a range of from 5 μm to 30 μm in view from sensitivity and image quality.

[3. Configuration of Scintillator Panel]
[3-1. Overall Configuration]

As shown in FIG. 1, the scintillator panel 10 has a support (substrate) 101, a scintillator 200 formed on the support 101 by a vapor deposition method, and a protective film (moisture-resistant film) 30 of parylene or the like for covering and sealing the scintillator 200 on the support 101. The protective film of parylene formed by a vapor deposition method has good adhesion to the scintillator 200 and further has flexibility. Thus, the protective film can well follow the warp or the like of the support 101.

The support 101 is formed into a plate-like shape out of a material of Al or the like, which is high in X-ray transmittance and which can reflect light. The support 101 is not limited to a plate made from Al. One of a carbon plate, a CFRP (Carbon Fiber Reinforced Plastic) plate, a glass plate, a quartz substrate, a sapphire substrate, etc. may be selected suitably and used as the support 101. The support 101 is not limited thereto particularly as long as the scintillator 200 can be formed on the surface of the support. However, light metal such as Al may be used as the material of the support when the support 101 is also used as a light reflecting member.

In the scintillator panel 10, the support 101 is not essential. That is, the scintillator 200 may be used after the scintillator 200 is formed by deposition using a substrate for deposition and separated from the substrate. A light reflecting member may be provided on the opposite side to the X-ray entrance side of the scintillator 200.

The scintillator 200 is formed by adding Tl as an activator to CsI used as a host. The activation of Tl can enhance the amount of luminescence of the scintillator.

The scintillator 200 in this example is formed using CsI:Tl (thallium doped cesium iodide) as a fluorescent material. The scintillator 200 may be formed using another fluorescent material such as NaI:Tl (thallium doped sodium iodide) or CsI:Na (sodium doped cesium iodide). The scintillator 200 is preferably formed using CsI:Tl as the material to obtain an emission spectrum in conformity to the maximum value (about 550 nm) of spectral sensitivity of an a-Si photodiode.

Figure 4:
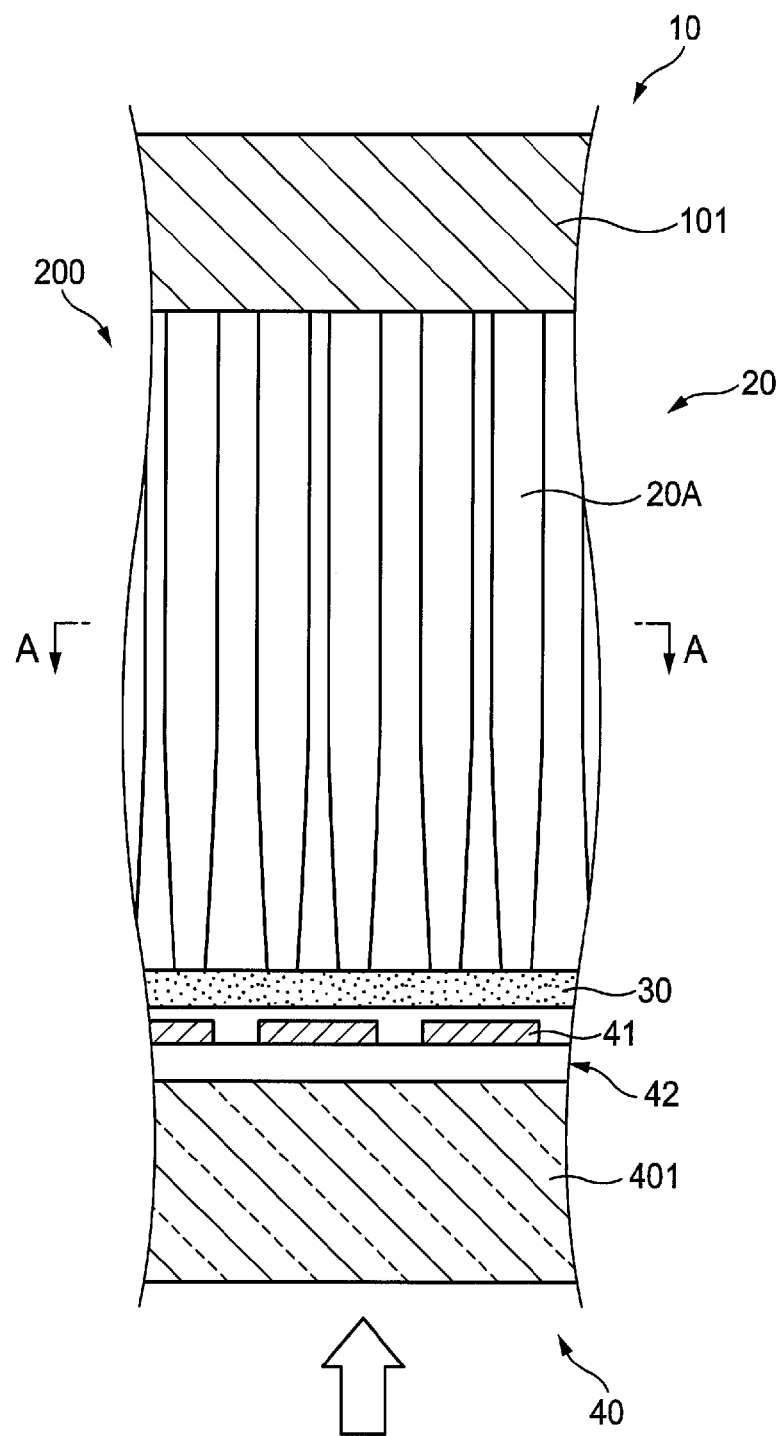
FIG. 4 is a side sectional view schematically showing a scintillator panel.

FIG. 4 is a side sectional view schematically showing the structure of the scintillator 200. The scintillator 200 has a columnar portion 20 which is formed out of a group of columnar crystals 20A.

Fluorescence emitted from the scintillator 200 when the scintillator 200 is irradiated with X-rays is guided in a columnar height direction by the columnar crystals 20A so as to enter the photodetector 40. On this occasion, light traveling on the support 101 side is reflected by the support 101 so as to enter the photodetector 40.

For example, OPC (Organic Photoelectric Conversion) materials, organic TFT, TFT using amorphous oxide (such as a-IGZO), flexible materials (aramid or bionanofiber) etc. may be used for the photodetector 40 and the scintillator panel 10. Those device-relevant materials will be described later.

[3-2. Configuration of Columnar Portion]

The columnar portion 20 is an aggregate of a large number of columnar crystals 20A. In the example shown in FIG. 4, each columnar crystal 20A stands substantially perpendicularly to the support 101. The columnar crystal 20A in the example is formed into a shape tapered on its front end side. The front end portion of the columnar crystal 20A may be polished. The front end portions of a plurality of columnar crystals 20A face one pixel (photoelectric conversion element 41) of the photodetector 40.

The columnar crystals 20A are better in crystallinity and larger in amount of emission of fluorescence than non-columnar crystals. In addition, the columnar crystals 20A adjacent to each other through an air gap are provided to stand in the thickness direction of the support 101, so that the columnar crystals 20A serve as light guide to guide light in the columnar height direction. Due to the light guide effect of the columnar crystals 20A, light diffusion among pixels can be suppressed to sharpen a detected image.

Figure 5:
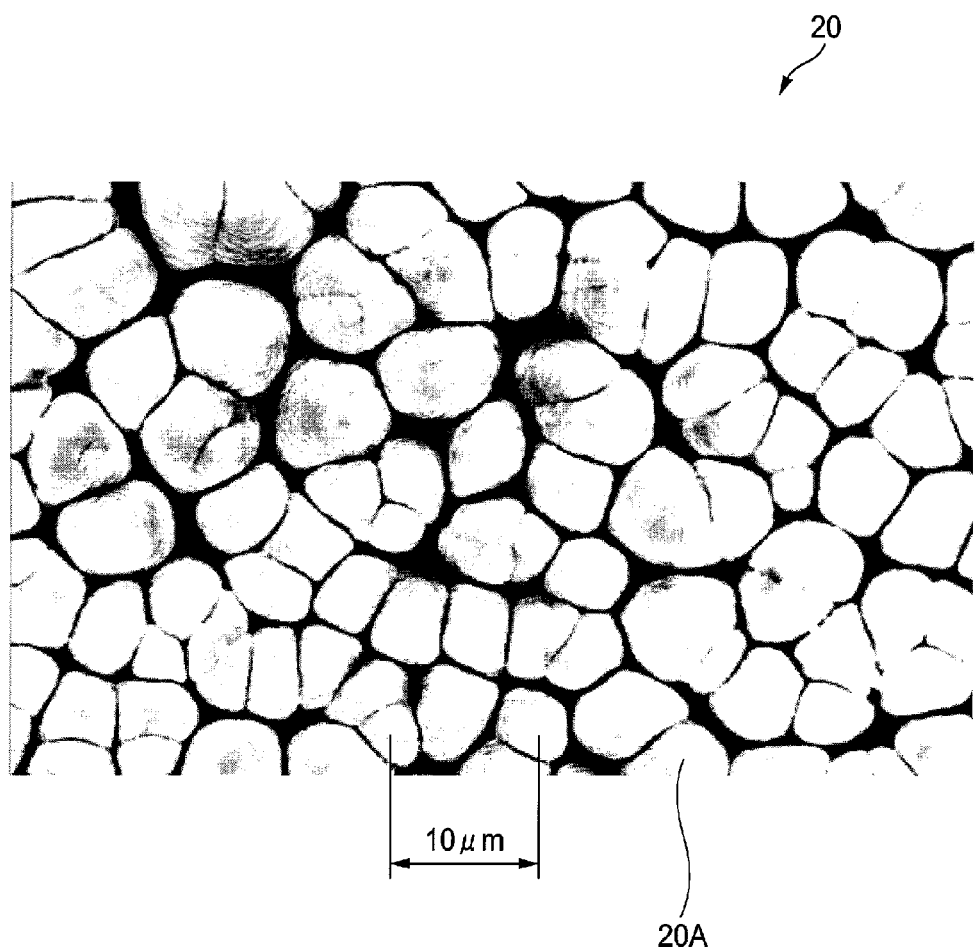
FIG. 5 is an electron microscope photograph (SEM image) sectionally showing columnar crystals of a columnar portion.

FIG. 5 shows an electron microscope photograph of the columnar portion 20 in section taken on line A-A in FIG. 4 (in section taken at the substantial center in the height direction of the columnar portion 20). There is an air gap between adjacent columnar crystals 20A (deep color portions in FIG. 5). Each columnar crystal 20A has a substantially uniform sectional diameter with respect to the growth direction of the crystal.

In consideration of X-ray absorption power corresponding to required sensitivity, the thickness of the columnar portion 20 is determined to be about 200 μm for use in mammography and not lower than 500 μm for use in general photography. When the columnar portion 20 is too thick, the utilization efficiency of luminescence is apt to deteriorate due to absorption and scattering of light, and so on. Therefore, the thickness of the columnar portion 20 is determined to be an appropriate value in consideration of both the sensitivity and the utilization efficiency of luminescence.

[3-3. Activator Density (Doping Density)]

Figure 6:
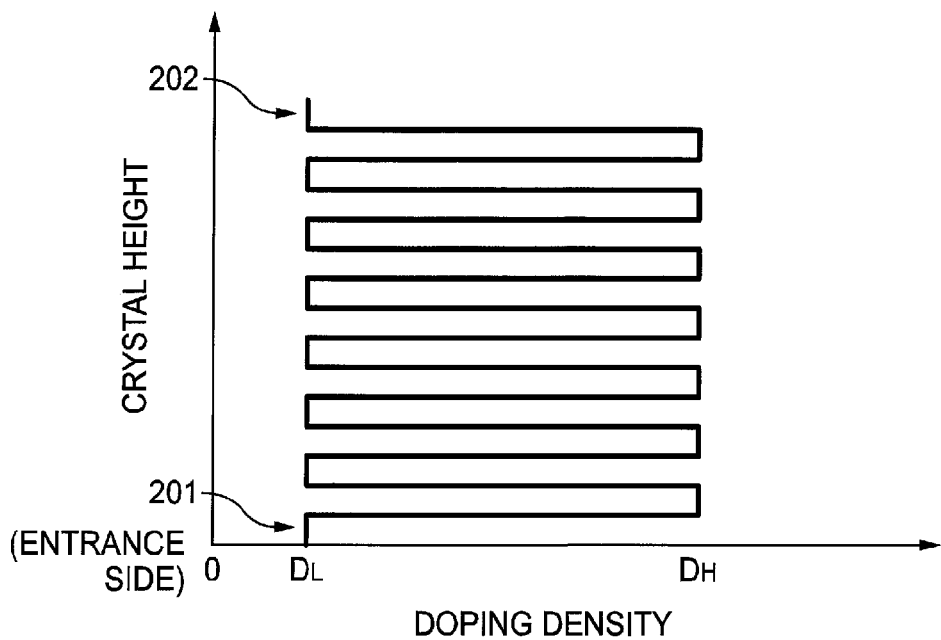
FIG. 6 is a graph showing doping density (activator density) to crystal height in a crystal growth direction in a scintillator.

As shown in FIG. 6, the Tl doping density (activator density) added to the scintillator 200 varies like pulses repeatedly between high density $D_H$ and low density $D_L$ in an X-ray travelling direction in a region including an X-ray entrance side portion of the scintillator 200. Here, the expression "doping density varies repeatedly" means that the doping density varies repeatedly in the order of high→low→high or low→high→low at least once. The number of repetitions of pulses is not limited particularly.

In addition, the doping density of each of a front end portion 201 of each columnar crystal located on the X-ray entrance side and a base end portion 202 of the columnar crystal located on the opposite side to the X-ray entrance side (both shown in FIG. 1) is set at the low density $D_L$. The low density $D_L$ may be zero.

Here, the X-ray image detection apparatus 1 shown in FIG. 1 is configured in such a manner that the photodetector 40 is disposed on the X-ray entrance side of the scintillator, and the scintillator panel constituted by the scintillator 200 formed by deposition on the support 101 is pasted onto the photodetector 40. With the configuration, the front end portion 201 is a portion of each columnar crystal on the sensor board 400 side and on the X-ray entrance side, and the base end portion 202 is a portion of each columnar crystal on the support 101 side and on the opposite side to the X-ray entrance side.

[4. Operation and Effect about Doping Density]

According to the aforementioned X-ray image detection apparatus 1, the following operation and effect can be obtained.

By doping like pulses in the scintillator 200, the effect to increase the amount of luminescence due to high doping density is exerted satisfactorily in the portion of the high density $D_H$, while the disorder of crystallinity is prevented in the portion of the low density $D_L$ to suppress absorption and diffusion of light, and so on, so that lowering of MTF can be suppressed. That is, due to the pulse-like doping, increase in amount of luminescence corresponding to the doping amount and increase in MTF can be made compatible.

In addition, the portion doped like pulses is a portion on the X-ray entrance side and on the photodetector 40 side in the scintillator 200. Accordingly, X-rays which are hardly attenuated immediately after transmitted through the sensor board 400 are incident on a region (serving as a main luminescent region) whose doping density is high and whose amount of luminescence is large. The X-rays are converted into fluorescence and the fluorescence rapidly enters the photodetector 40, so that the effect to increase the amount of luminescence when the doping density is increased can be obtained to the utmost. Thus, the amount of light incident on the photodetector 40 can be increased and the amount of usable luminescence of the scintillator panel 10 can be increased.

Here, the doping density in the base end portion 202 of each columnar crystal located on the opposite side to the X-ray entrance side and far away from the photodetector 40 is the low density $D_L$. Thus, the disorder of crystallinity in the early stage of growth of deposition of the columnar crystal 20A can be suppressed so that the crystallinity in the subsequent crystal growth becomes good enough so as to be able to secure the light guide effect substantially in the whole of the columnar crystal 20A in the height direction. If the doping density were high on the base end side of the columnar crystal, the crystallinity in the second half of crystal growth would deteriorate easily and plenty of luminescence in the portion with deteriorated crystallinity would enter the photodetector 40 to lower MTF greatly. However, since the doping density in the base end portion 202 is low, light emitted in a portion far away from the photodetector 40 or light traveling to leave the photodetector 40 can be suppressed from being absorbed, and the light can be prevented from being diffused among the columnar crystals 20A. It is therefore possible to suppress the lowering of MTF.

Since the doping density in the front end portion 201 of the columnar crystal 20A is also low, the disorder of crystallinity in the front end portion of each columnar crystal can be suppressed so as to avoid the lowering of the strength and the resistance to moisture absorption can be secured, in addition to the aforementioned effect. That is, while increase in doping density can increase the amount of luminescence as described above, the increase in doping density leads to disorder of crystallinity to lower the strength in the portion where the crystallinity is disordered. Thus, there is a fear that the front end portion 201 of the columnar crystal 20A may be damaged when the scintillator 200 and the sensor board 400 are pasted onto each other or when a load is applied to the scintillator panel. To solve the problem, the doping density in the front end portion 201 of the columnar crystal is set at the low density $D_L$ so that the strength of the front end portion 201 can be secured. By securing the strength of the front end portion 201, the withstand load of the scintillator panel can be increased.

In addition, the resistance to moisture absorption is lowered in CsI doped with Tl. Accordingly, when the sealing of the scintillator 200 with the protective film 30 and the sensor board 400 is lowered at the time of manufacturing or in use, the performance of the scintillator begins to deteriorate. In spite of the lowering of the sealing, the resistance to moisture absorption is secured in the front end portion 201 of each columnar crystal because the doping density of the front end portion 201 is the low density $D_L$. Thus, the deterioration of the performance of the scintillator 200 can be suppressed (the deterioration can be delayed). It can be considered that the sealing deteriorates for the following reasons. That is, the protective film 30 is broken when the scintillator panel 10 and the sensor board 400 are pasted onto each other; the scintillator is broken due to the narrow front end portions of the columnar crystals 20A in other steps; or the protective film 30 is partially separated from the sensor board 400 at the time of impact to lower the moisture resistance at that portion. In addition, when the photoelectric conversion elements 41 and the switching devices 42 are separated from the substrate in use, moisture is easily penetrated into the scintillator 200 through the switching devices 42 or the like. In such a case, the scintillator 200 can keep the resistance to moisture absorption to suppress deterioration of the performance.

It is also advantageous that the doping density in the base end portion 202 of each columnar crystal is low to be able to secure the strength high enough to avoid damage at the impact of falling down or the like, and to secure the resistance to moisture absorption when the substrate is separated due to the impact.

In addition, it is preferable that the front end portion 201 of each columnar crystal set at the low density $D_L$ is thin to such an extent that the strength corresponding to a load applied in the aforementioned pasting step can be secured and the resistance to moisture absorption can be kept. Here, also at the point of view from absorption and diffusion of light and so on in the front end portion 201, it is advantageous that the doping density of the front end portion 201 is low. It is preferable that the front end portion 201 is not thicker than 50 μm. When the front end portion 201 is thin in this manner, attenuation and scattering of light, and so on, in the front end portion 201 are negligible. In addition, it is preferable that the front end portion 201 is not thinner than 5 μm to secure the strength.

As described above, according to the X-ray image detection apparatus 1, the configuration has characteristics of pulse-like doping in at least a part of the scintillator 200, doping with low density in the base end portion 202 of each columnar crystal and doping with low density in the front end portion 201 of the columnar crystal. With the configuration, increase in amount of luminescence corresponding to the amount of doping and increase in MFT are compatible. In addition, the strength of the crystals can be improved, and the resistance to moisture absorption when the protective film is broken or separated from the substrate can be also improved.

According to such an X-ray image detection apparatus 1, an X-ray image can be detected with high sensitivity and high definition while the reliability can be also improved.

The aforementioned X-ray image detection apparatus 1 can be incorporated and used in various systems such as a medical X-ray imaging system. Particularly, the X-ray image detection apparatus 1 in the example having characteristics of high sensitivity and high definition can be preferably applied to mammography equipment required to detect a sharp image with a low dose of radiation. Further, when the X-ray image detection apparatus 1 is arranged as a portable cassette which can be removably attached to an X-ray imaging system, it is likely that the X-ray image detection apparatus 1 may suffer an impact of falling down, and it is important to secure the strength of the scintillator and secure the resistance to moisture absorption when the substrate is separated. Thus, the aforementioned effect to secure the strength and secure the resistance to moisture absorption is great. Particularly, when the X-ray image detection apparatus is pasted to a housing such as a cassette top plate, it is possible to obtain an effect that the scintillator 200 is hardly damaged even when receiving a load from the housing.

In addition to the medical X-ray imaging system, for example, the X-ray image detection apparatus 1 is also applicable to an industrial X-ray imaging system for nondestructive inspection, or a system for detecting particle rays (α-rays, β-rays, γ-rays) other than electromagnetic waves. The X-ray image detection apparatus 1 has a wide range of applications.

[5. Other Examples of Doping Density Distribution]

Figure 7:
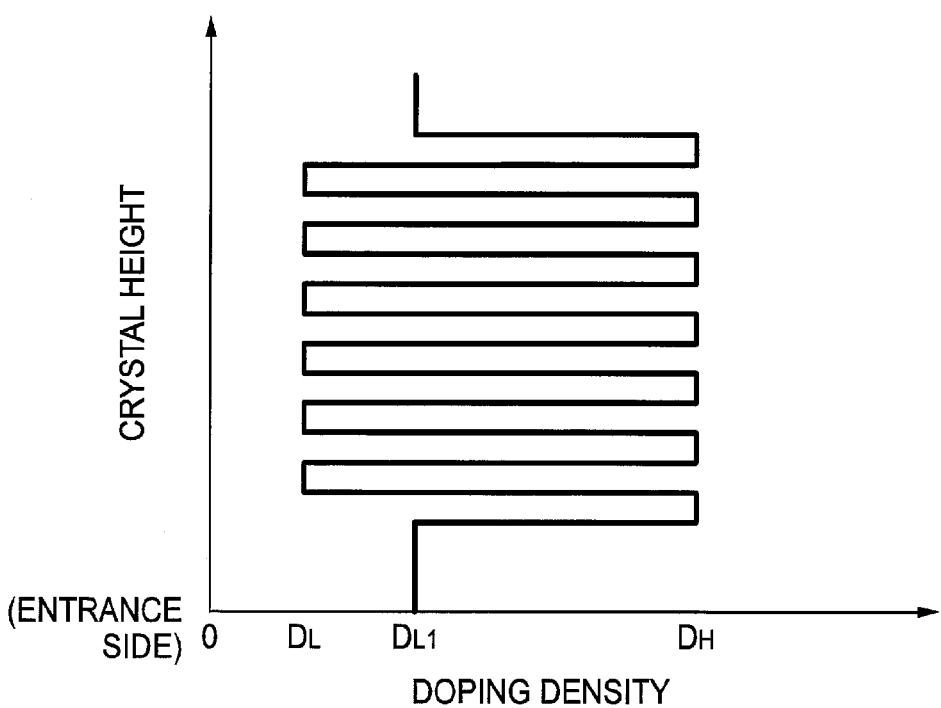
FIG. 7 is a graph showing another example of a change in doping density.

FIG. 7 shows another example of doping density in the scintillator described with reference to FIG. 6. As shown in FIG. 7, the doping density in the front end portion 201 of each columnar crystal located on the X-ray entrance side may be density between the high density $D_H$ and the low density $D_L$. On the other hand, the doping density in the base end portion 202 of each columnar crystal located on the opposite side to the X-ray entrance side may be density between the high density $D_H$ and the low density $D_L$. That is, a similar effect to the aforementioned effect can be obtained if the doping density in the base end portion 202 and the front end portion 201 is lower than the high density $D_H$.

Figure 8:
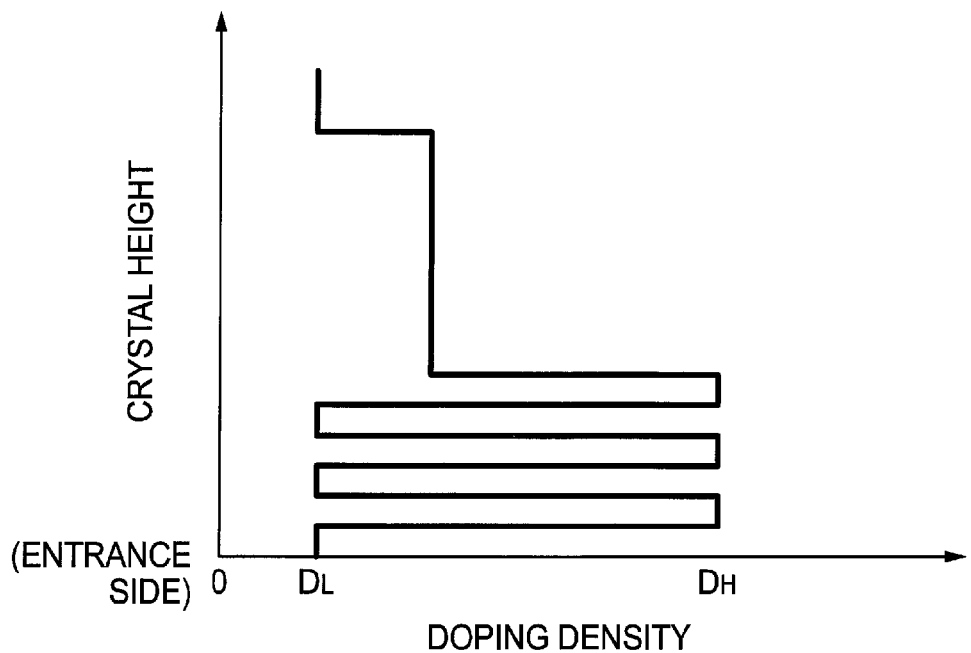
FIG. 8 is a graph showing another example of a change in doping density.

In addition, FIG. 8 shows another example of doping density distribution in the scintillator provided by the X-ray image detection apparatus in FIG. 1. In FIG. 6, the region where the doping density varies like pulses ranges substantially the whole of the scintillator. On the other hand, in FIG. 8, the region where the doping density varies like pulses is limited to an X-ray entrance side portion of the scintillator. The portion on the opposite side to the X-ray entrance side (the portion including the base end portion 202 of each columnar crystal) in the scintillator is a region where the doping density is lower than the high density $D_H$.

Here, the region on the opposite side to the X-ray entrance side, that is, the base end side of each columnar crystal is not a main luminescent region. Therefore, a sufficient amount of luminescence can be secured even if the doping density is reduced in that region. When the thickness of the portion whose doping density is high is reduced, the usage of an expensive activator can be reduced to decrease the cost.

In addition, in the configuration of FIG. 1, the portion on the opposite side to the X-ray entrance side is located in the base end portion 202 of each columnar crystal (the portion in the early stage of crystal growth). Therefore, the disorder of crystallinity in the second half of crystal growth can be prevented more surely when the doping density in that portion is reduced. That is, when the doping density in the portion having smaller contribution to luminescence (the portion far from the front end portion 201 on the X-ray entrance side) is reduced, it is possible to obtain an effect to increase the amount of luminescence and suppress the lowering of MTF satisfactorily with a moderate value of doping density.

Figure 9:
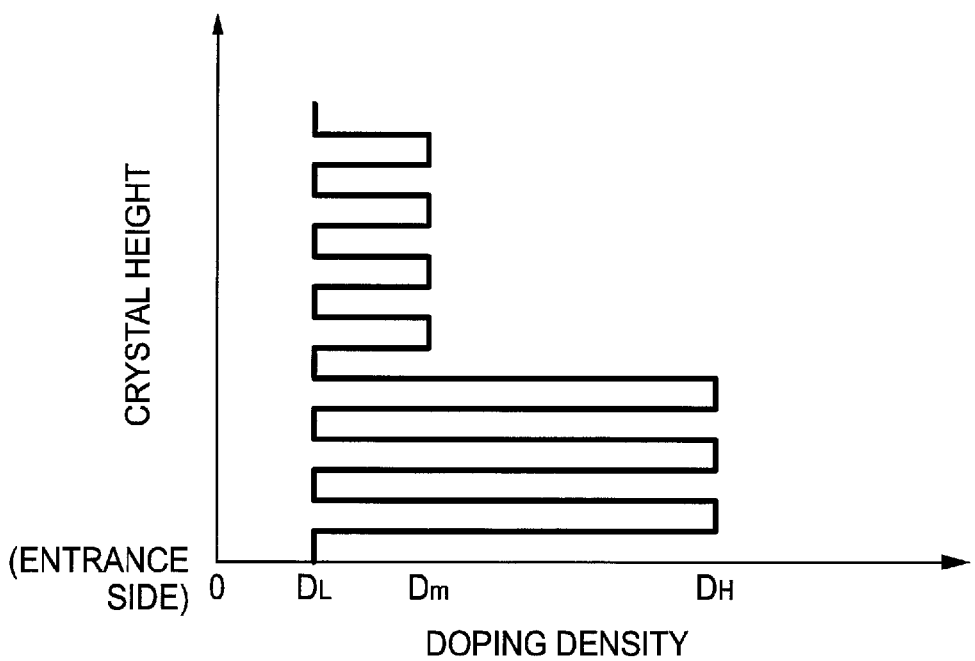
FIG. 9 is a graph showing another example of a change in doping density.

FIG. 9 shows an example in which the doping density in a portion on the opposite side to the X-ray entrance side is varied like pulses in the configuration shown in FIG. 8. In this manner, portions with middle density $D_M$ and portions with low density $D_L$ are combined to vary the doping density like pulses, so that the disorder of crystallinity in the second half of crystal growth can be suppressed more greatly.

Figure 10:
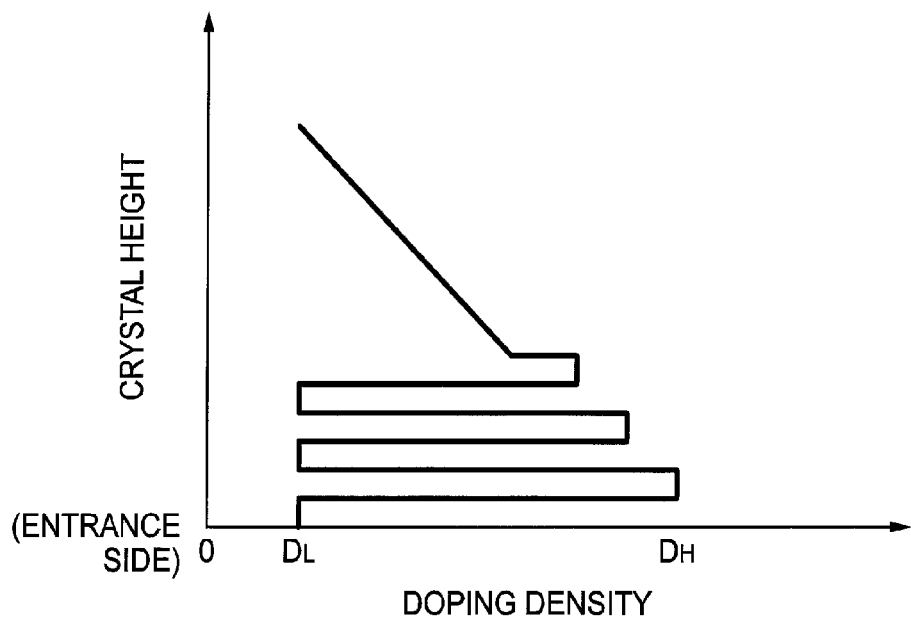
FIG. 10 is a graph showing another example of a change in doping density.

FIG. 10 shows another example of doping density distribution in the scintillator. The doping density distribution may have a gradient in the crystal height direction (X-ray travelling direction) in this manner. Here, in the portion where the doping density varies like repeated pulses, the doping density in high-density portions decreases gradually from the maximum density $D_H$ in the X-ray travelling direction, while the doping density in a portion which is located on the opposite side to the X-ray entrance side and where the doping density does not vary like pulses decreases straightly in the X-ray travelling direction.

Figure 11:
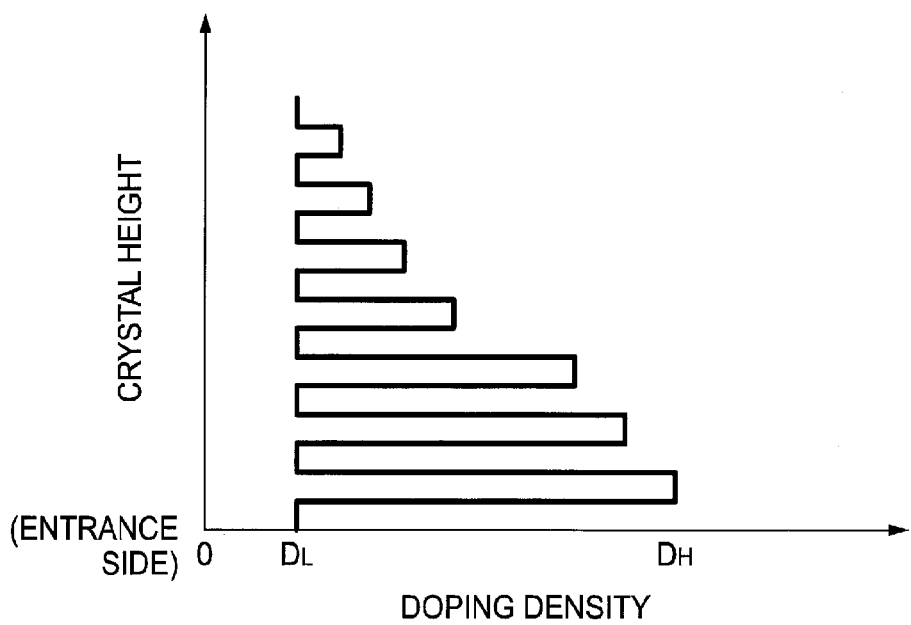
FIG. 11 is a graph showing another example of a change in doping density.

FIG. 11 shows an example in which the doping density in a portion on the opposite side to the X-ray entrance side is reduced like pulses in the configuration of FIG. 10. The density in high-density portions of the pulses decreases gradually in the X-ray travelling direction from the X-ray entrance side position.

Figure 12:
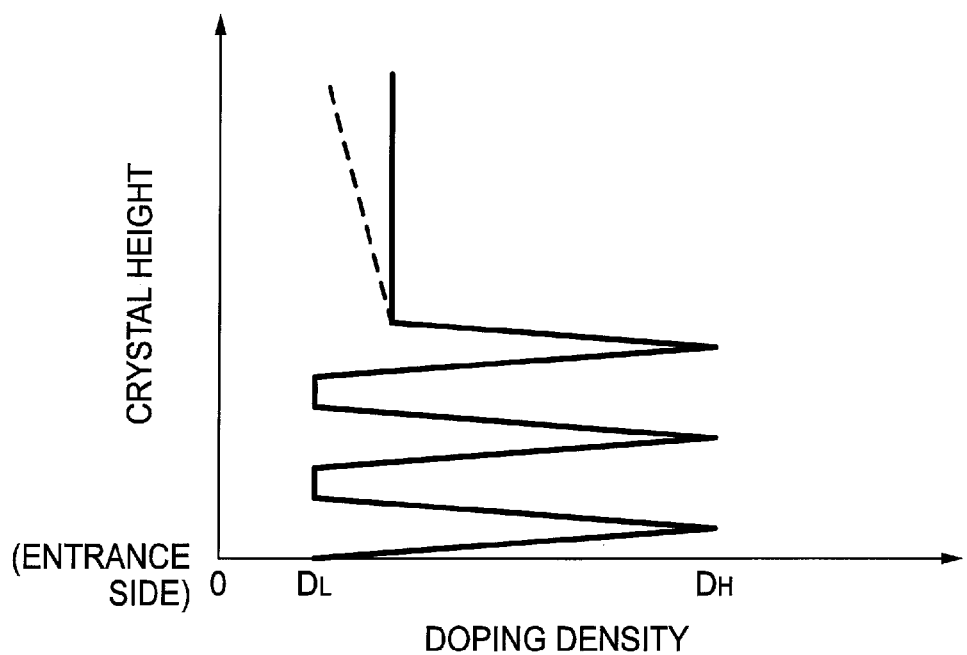
FIG. 12 is a graph showing another example of a change in doping density.

The aforementioned configuration shows repeated pulses of rectangular waves. However, the form of the pulses is not limited to the aforementioned form, but may be arranged as shown in FIG. 12. That is, each pulse may have a shape substantially like a triangular wave with an inclination at each of the rising edge and the trailing edge of the pulse. Also by doping in such a pulse-like form, the doping density varies intermittently and repeatedly between high density $D_H$ and low density $D_L$, so that a similar effect to the aforementioned effect can be obtained. As shown by the broken line in FIG. 12, a gradient may be provided in the doping density in a portion on the opposite side to the X-ray entrance side.

The doping density distributions of FIGS. 6 to 12 described above are not limited to the X-ray image detection apparatus 1 in FIG. 1 but may be applied to any X-ray image detection apparatus shown in FIGS. 15 to 17, which will be described later.

Figure 13:
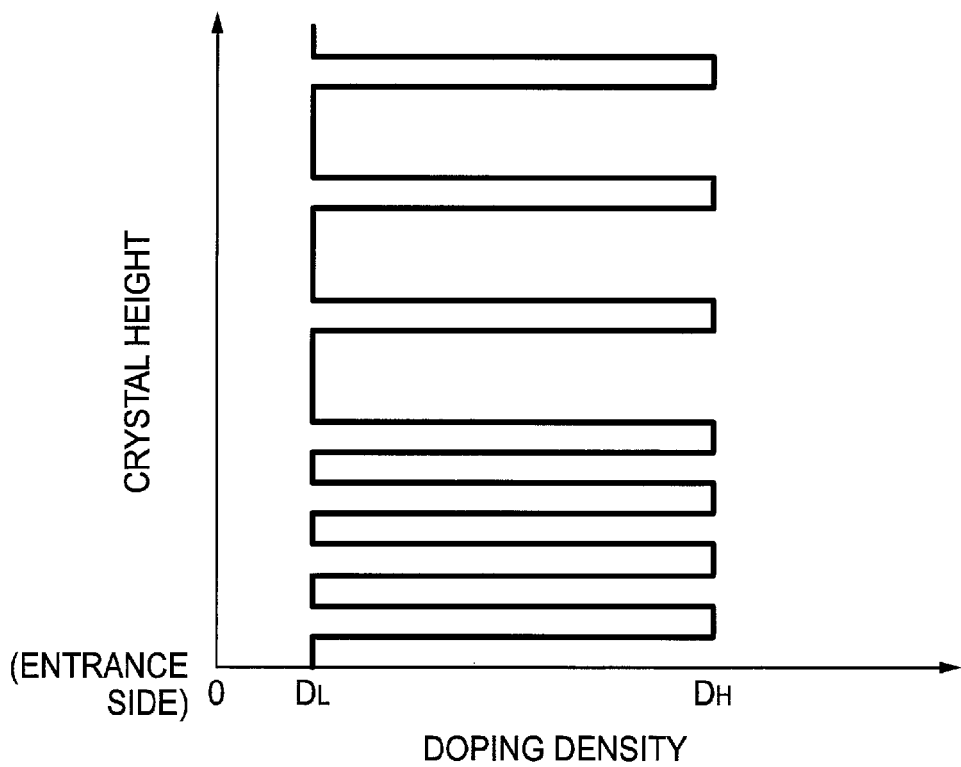
FIG. 13 is a graph showing another example of a change in doping density.

In addition, the interval between pulses, the pulse width, the duty ratio, etc. in the variation of the doping density may be changed. For example, as shown in FIG. 13, the pulse interval and the pulse width may be narrowed on the X-ray entrance side while the pulse interval and the pulse width are widened on the opposite side to the X-ray entrance side. Such an activator density distribution is effective particularly in a configuration in which X-rays are incident on the scintillator from the sensor side and a configuration in which the scintillator formed on the support is pasted onto the sensor. When the pulse interval etc. is widened, the disorder of crystallinity in the early stage of deposition can be suppressed so that the conspicuous disorder of crystallinity in the second half of the deposition can be suppressed effectively.

[6. Method for Manufacturing X-Ray Image Detection Apparatus]

Next, description will be made on a method for manufacturing the aforementioned X-ray image detection apparatus 1.

It is preferable that the aforementioned scintillator 200 is formed on the surface of the support 101 by a vapor deposition method. Here, a mode in which CsI:Tl is used will be described by way of example.

The vapor deposition method will be described briefly. Under the environment with a degree of vacuum of 0.01 to 10 Pa, CsI as a host and Tl as an activator are heated and evaporated respectively, for example, in resistance heating crucibles to which electric power is applied. Thus, CsI:Tl is deposited on the support 101 whose temperature is set at a room temperature (20° C.) to 300° C.

Here, the electric power applied to the Tl crucible is changed to change the heating temperature of Tl, or the degree of vacuum etc. is changed. In such a manner, it is possible to form a scintillator whose doping density varies repeatedly between the high density $D_H$ and the low density $D_L$ (scintillator forming step). As for a method for controlling the doping density, for example, when the electric power applied to the Tl crucible is increased, the doping density can be increased. When the electric power applied to the crucible of Tl is decreased, the doping density can be decreased. Alternatively, the kind of activator may be changed to thallium sulfate, thallium oxide, thallium iodide, thallium carbonate or the like (Tl containing compound may be changed), to change the doping density. The change of the Tl containing compound and the change of the deposition cell temperature may be combined to change the doping density. Further, doping may be performed by ion implantation to change the doping density. In addition, the crystal shape, the crystal diameter, the void ratio, etc. of the scintillator 200 can be controlled by changing the degree of vacuum, the temperature of the support, the rate of deposition, or the like.

After the scintillator 200 is formed on the support 101, the protective film 30 is formed by deposition using parylene or the like so as to seal off the scintillator 200 on the support 101. Thus, the scintillator panel 10 is manufactured. The protective film 30 does not have to be formed when moisture resistance is secured in the scintillator 200 by another method such as a moisture-resistant film for enclosing the scintillator panel 10 air-tightly and water-tightly.

The sensor board 400 is pasted to the scintillator panel 10 from the opposite side to the support 101 so as to be integrated therewith. By the pasting step performed thus, the X-ray image detection apparatus 1 can be obtained. The method for pasting the scintillator 200 and the sensor board 400 to each other is not limited particularly. Any other method may be used as long as the scintillator 200 and the sensor board 400 can be coupled optically. As the method for pasting the scintillator 200 and the sensor board 400 to each other, either a method for making the scintillator 200 and the sensor board 400 face each other and adhere to each other or a method for making the scintillator 200 and the sensor board 400 adhere to each other through a resin layer may be used.

[7. Modifications of Scintillator]

Figure 14:
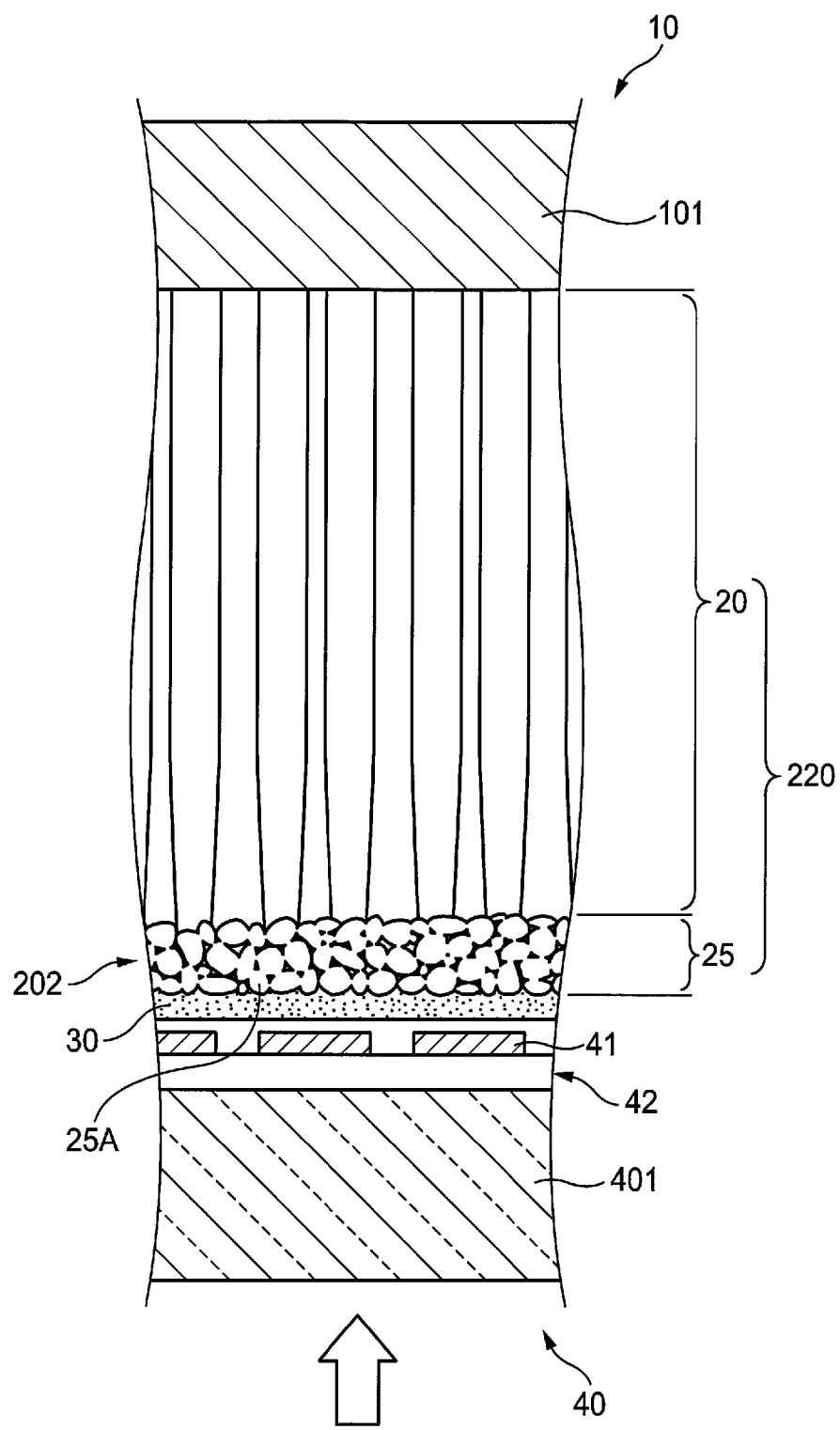
FIG. 14 is a side sectional view of a modification about the configuration of FIG. 4, schematically showing a scintillator panel having a non-columnar portion.

FIG. 14 shows a scintillator 220 having a different configuration from that of the aforementioned scintillator 200. The scintillator 220 is formed to include non-columnar crystals 25A provided at the front ends of the columnar crystals 20A.

After the columnar portion 20 is formed in the aforementioned scintillator manufacturing step, the non-columnar portion 25 may be formed in at least one of the following operations. That is, the degree of vacuum is decreased; the temperature of the support is lowered; or the rate of deposition is increased.

The configuration of the non-columnar portion 25 will be described in detail. The non-columnar portion 25 is formed to include non-columnar crystals 25A each of which has a substantially spherical shape or an indeterminate shape as shown in FIG. 14. The non-columnar portion 25 may include amorphous portions. In the non-columnar portion 25, the non-columnar crystals 25A whose diameters are smaller than the columnar crystals 20A in FIG. 5 are irregularly coupled with one other or laid on one another, so that distinct voids can be hardly recognized among the crystals.

It is preferable that the non-columnar portion 25 is not thinner than 3 μm and not thicker than 50 μm. It is preferable that the non-columnar portion 25 is not thinner than 3 μm, in order to surely cover the front end portion of the columnar portion 20 in the crystal growth direction (at least between the columnar crystals 20A and 20A) to thereby flatten the surface of the scintillator 240. On the other hand, when the non-columnar portion 25 having no light guide effect is too thick, light is mingled among pixels in the non-columnar portion 25 to produce blurring in an image easily. It is therefore preferable that the non-columnar portion 25 is not thicker than 50 μm.

In addition, the minimum thickness of the non-columnar portion 25 is sufficient as long as the non-columnar portion 25 can cover the front end portion of the columnar portion 20 surely. That is, if the thickness of the non-columnar portion 25 is reduced, the usage of the fluorescent material which is expensive can be reduced to reduce the cost.

Since the non-columnar portion 25 is thin, absorption and scattering of light emitted from the columnar crystals 20A in the non-columnar portion 25 is negligible.

In accordance with manufacturing conditions etc., the non-columnar portion 25 may have a structure in which not a single layer but a plurality of layers are laminated. In such a case, the thickness of the non-columnar portion 25 corresponds to the thickness between the front end of each columnar crystal 20A in the crystal growth direction and the surface of the outermost layer of the non-columnar portion 25.

The void ratio of the non-columnar portion 25 is calculated based on the area of the non-columnar portion 25 in plan view, the thickness of the non-columnar portion 25, the density of CsI, the weight of the scintillator panel 10 measured actually, etc. The thus calculated void ratio of the non-columnar portion 25 as a whole in the thickness direction thereof is not higher than 10%, more preferably 0 or substantially 0.

That is, it is preferable that the non-columnar portion 25 is thin to prevent absorption and scattering of light. Even when the non-columnar portion 25 is thin, it is preferable that the void ratio of the non-columnar portion 25 is low to cover the front end portion of the columnar portion 20 and flatten the scintillator 220. It is preferable that the void ratio of the non-columnar portion 25 is small in order to prevent the material of the protective film 30 from flowing into gaps between the columnar crystals 20A.

A size in a wide range may be used for each non-columnar crystal 25A of the non-columnar portion 25. It is preferable that the size of the non-columnar crystal 25A which has a substantially spherical shape is extremely small to make the void ratio close to zero in order to cover the front end of the columnar portion 20 with the non-columnar portion 25. In addition, in the same logic, it is preferable that the non-columnar crystals 25A are coupled with one another to increase the diameter to make the void ratio close to zero. Therefore, the crystal size in the non-columnar portion 25 may be determined suitably as long as the crystal size is not too large to secure flatness in the scintillator surface.

At least gaps between the columnar crystals 20A and 20A in the front end portion of the columnar portion 20 in the growth direction are covered with the non-columnar portion 25. Thus, a portion of the scintillator 220 facing the sensor board 400 is flattened without requiring any method easily causing thermal deformation of the support, for example, a method for controlling the temperature of the support during deposition. As a result, the protective film 30 is prevented from being broken by the front end portions of the columnar crystals 20A, so that air tightness can be secured with the protective film 30. Thus, the scintillator 220 can be prevented from deteriorating in performance due to deliquescence of the scintillator 220.

The aforementioned protective film 30 covers the flattened surface of the non-columnar portion 25. The scintillator 220 is made to adhere to the sensor board 400 through the protective film 30. As described above, the scintillator 220 is flattened sufficiently due to the low void ratio of the non-columnar portion 25. Thus, the adhesion is satisfactory.

Since the non-columnar portion 25 configured as described above is provided, the air gaps among the columnar crystals 20A are filled with the non-columnar portion 25 in the front end portion of the columnar portion 20. Thus, the strength of a sensor board 400 side portion in the scintillator 220 is improved. Due to the low void ratio of the non-columnar portion 25 as described above, the strength of the scintillator 220 is improved more greatly.

Due to improvement in the strength of the scintillator 220, strength against a load applied when the sensor board 400 and the scintillator panel are pasted to each other is more secured in the scintillator 220. Due to the secured strength of the scintillator 220, the scintillator 220 and the sensor board 400 can be made to adhere to each other through the protective film 30 uniformly without causing any damage to the scintillator 220 even if the scintillator panel is pressed strongly against the sensor board. When there is unevenness in the adhesion between the scintillator 220 and the sensor board 400, unevenness appears in a detected image easily. However, the quality of the detected image can be made uniform without such unevenness.

Due to improvement in the aforementioned strength of the scintillator 220, shock resistance of the X-ray image detection apparatus can be improved. In addition, due to improvement in the adhesion between the scintillator 220 and the sensor board 400, external force applied to the scintillator 220 in the shock of falling-down or the like can be cushioned by the sensor board 400 so that the shock resistance is improved also in view from this point.

In addition to the above description, due to the secured adhesion to the sensor board 400, it is possible to prevent the scintillator 220 and the sensor board 400 form being separated from each other due to a difference in the coefficient of thermal expansion.

In addition, due to the non-columnar portion 25, the material such as parylene can be prevented from entering among the columnar crystals 20A when the protective film 30 is formed. When parylene or the like enters an air gap between adjacent columnar crystals 20A, a difference in refractive index between each of the columnar crystals 20A and a region between the columnar crystals 20A is reduced to increase the critical angle of light. Thus, the performance with which the columnar crystals 20A guide the light in the thickness direction deteriorates. Specifically, the light guide performance deteriorates from the condition that the refractive index of CsI is 1.8, the refractive index of the air is 1 and the critical angle is 34° to the condition that the refractive index of CsI is 1.8, the refractive index of parylene is 1.5 and the critical angle is 56°. Formation of the non-columnar portion 25 can prevent occurrence of such a problem.

Also in the aforementioned non-columnar portion 25, doping may be performed at low density. That is, doping at lower density than the high density $D_H$ in the region where the doping density varies like pulses may be also performed in the non-columnar portion 25. Thus, it is possible to obtain a similar effect to the effect obtained by the low doping density in the front end portions 201 of the columnar crystals 20A.

Of light emitted by the scintillator, light travelling on the opposite side to the sensor board 400 is reflected toward the sensor board 400 so that the amount of the emitted light which can be utilized can be increased. In the configuration shown in FIG. 1 and so on, light is reflected by the support 101 made from Al or the like. However, a reflective layer may be formed in the scintillator. For example, a second non-columnar portion including non-columnar crystals is formed on the opposite side (that is, the support 101 side) of the columnar portion 20 to the sensor board 400, so that reflective characteristic can be given to the scintillator. When such a second non-columnar portion is interposed between the support 101 and the columnar portion 20, the columnar crystals 20A can be grown with good crystallinity on the second non-columnar portion as a base, and the scintillator can be prevented from being easily separated from the support even if heat is propagated from a control module to the scintillator.

[8. X-Ray Image Detection Apparatus According to Other Modes]

Figure 15:
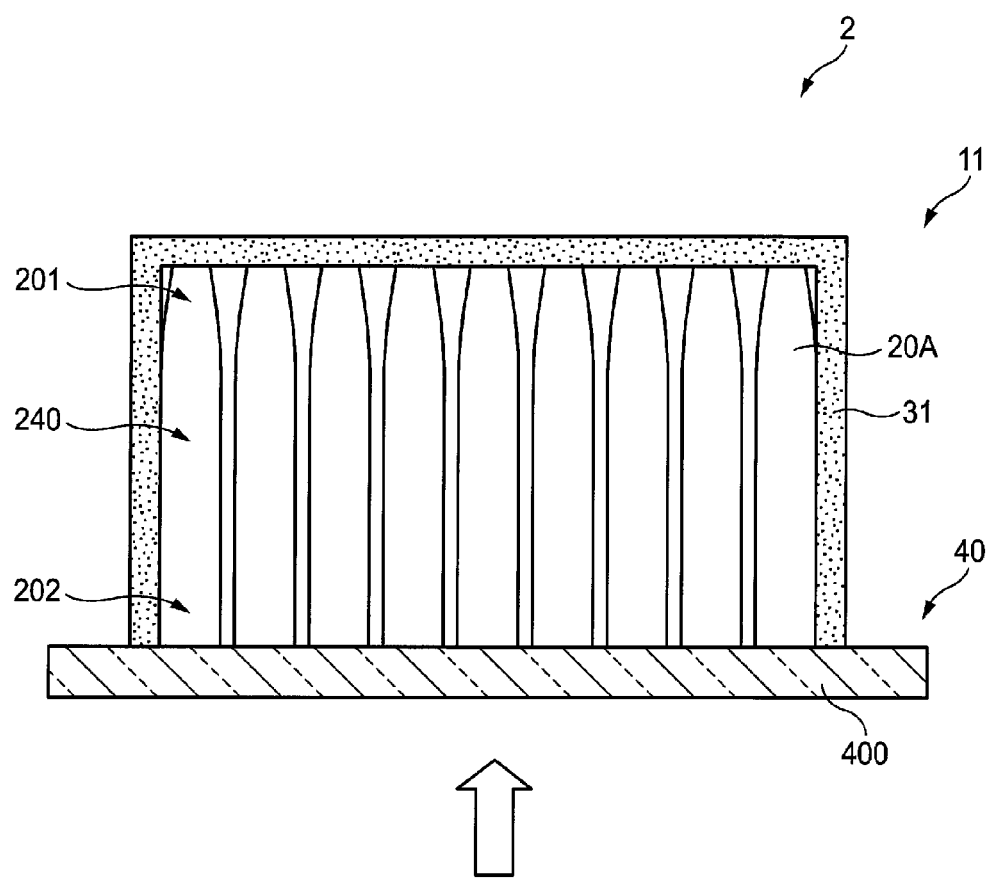
FIG. 15 is a side sectional view showing an X-ray image detection apparatus of a direct deposition system in which a scintillator is deposited on a sensor board.

Differently from the X-ray image detection apparatus 1 in FIG. 1, an X-ray image detection apparatus 2 shown in FIG. 15 does not have the support 101. A scintillator 240 of the X-ray image detection apparatus 2 is deposited on the sensor board 400. The aforementioned doping density distributions of FIGS. 6 to 12 may be also applied to the configuration of FIG. 15. In addition, FIGS. 6 to 12 may be combined in the scintillator portion where plenty of X-rays are absorbed, in order to suppress the disorder of crystallinity. In the configuration of FIG. 15, differently from the configuration of FIG. 1, the front end portion 201 of each columnar crystal 20A is disposed in a position on the opposite side to the X-ray entrance side in the scintillator. On the other hand, the base end portion 202 of the columnar crystal 20A is disposed in a position on the X-ray entrance side and close to the photodetector 40 in the scintillator.

When the doping density in a region including the base end portion 202 of each columnar crystal 20A is increased simply in the configuration of FIG. 15, the crystallinity deteriorates conspicuously easily in the second half of crystal growth. Thus, plenty of light emitted from the portion whose crystallinity deteriorates enters the photodetector 40 and deteriorates MTF greatly. Accordingly, when the doping density in the base end portion 202 of each columnar crystal is set at low density as shown in FIG. 6 or the like, there is a great effect to suppress the disorder of crystallinity in the second half of crystal growth.

Here, also when the doping density distributions of FIGS. 6 to 12 are applied to the configuration of FIG. 15, pulse-like doping, low-density doping in the base end portion 202 of each columnar crystal and low-density doping in the front end portion 201 of the columnar crystal work together in the same manner as in FIG. 1. Due to the configuration achieved thus, a similar effect to the aforementioned effect can be obtained.

In the configuration of FIG. 15, the scintillator and the photodetector 40 do not have to be pasted to each other. Accordingly, there is no fear that a load in the pasting step may be applied to the scintillator 240 in FIG. 15. However, due to the low doping density, the disorder of crystallinity in the base end portion 202 and the front end portion 201 can be suppressed to maintain the crystal strength. It is therefore possible to prevent the scintillator from be damaged due to an impact of falling down. In addition, even if the columnar crystals are separated from the sensor board due to the impact, the deterioration of the scintillator can be suppressed because the resistance to moisture resistance can be secured by the low doping density.

Figure 16:
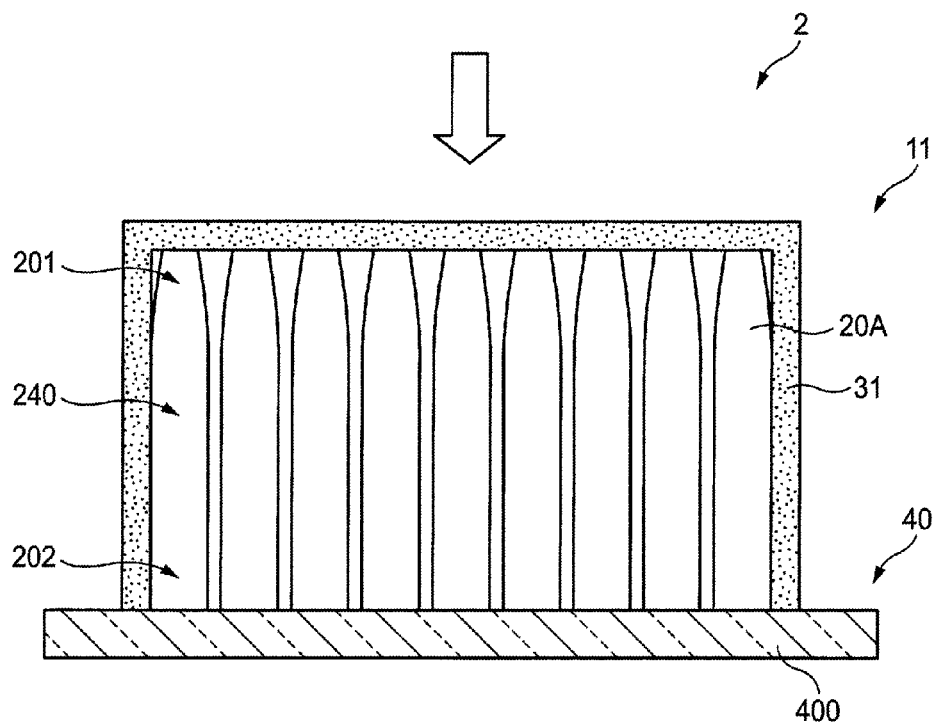
FIG. 16 is a side sectional view showing a state where the X-ray image detection apparatus in FIG. 15 is irradiated with X-rays from an opposite direction to the X-ray irradiation direction of FIG. 15.

FIG. 16 shows a configuration in which the X-ray image detection apparatus 2 in FIG. 15 is irradiated with X-rays from the opposite side to that in FIG. 15. The travelling direction of X-rays differs in this manner. Therefore, when the doping density distributions shown in FIGS. 6 to 12 are applied, understanding is easy if these figures are looked upside down. In the configuration of FIG. 16, the front end portion 201 of each columnar crystal 20A is located on the X-ray entrance side, and the base end portion 202 of the columnar crystal 20A is located on the side (the sensor board 400 side in this case) opposite to the X-ray entrance side, in the same manner as in the X-ray image detection apparatus 1 in FIG. 1. Also in the configuration of FIG. 16, the doping density distributions of FIGS. 6 to 12 may be applied, and a similar effect to the aforementioned effect can be obtained by pulse-like doping density and the low doping density in the front end portion 201 and the base end portion 202.

The configuration of FIG. 16 is different from the configuration of FIG. 1 at the point of a difference in distance between the main luminescent region on the X-ray entrance side and the photodetector 40. That is, in the configuration of FIG. 16, the distance between the photodetector 40 and the main luminescent region is so large, and absorption of light emitted from the main luminescent region is so large that MTF can deteriorate easily. According to the configuration of FIG. 16, therefore, the aforementioned effect to prevent the disorder of crystallinity to thereby suppress the lowering of MTF can be increased.

Figure 17:
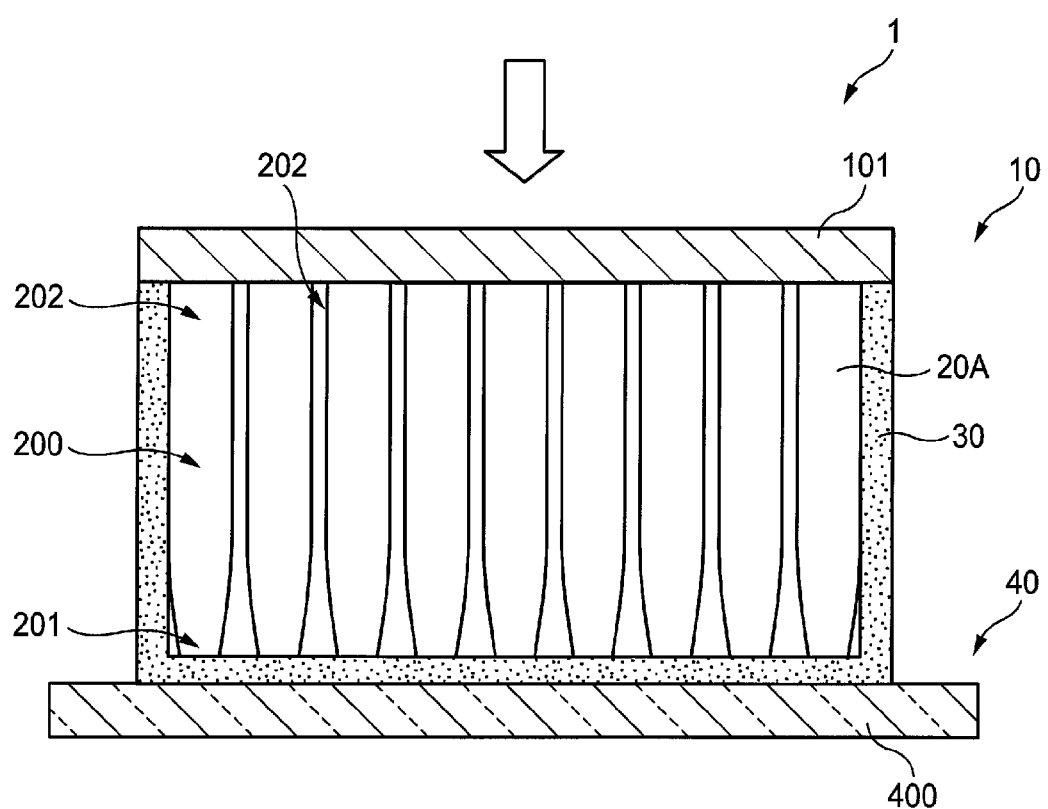
FIG. 17 is a side sectional view showing a state where the X-ray image detection apparatus in FIG. 1 is irradiated with X-rays from an opposite direction to the X-ray irradiation direction of FIG. 1.

FIG. 17 shows a configuration in which the X-ray image detection apparatus 1 shown in FIG. 1 is irradiated with X-rays from the opposite side to that in FIG. 1. In the configuration of FIG. 17, the base end portion 202 of each columnar crystal 20A is located on the X-ray entrance side, and the front end portion 201 of the columnar crystal 20A is located on the side (the sensor board 400 side in this case) opposite to the X-ray entrance side. In addition, in the configuration of FIG. 17, the scintillator 200 deposited on the support 101 is pasted to the photodetector 40 in the same manner as in FIG. 1, and the scintillator 200 is irradiated with X-rays from the opposite side to the photodetector 40 in the same manner as in FIG. 16. Also in the configuration of FIG. 17, the doping density distributions shown in FIGS. 6 to 12 may be applied.

Here, in the configuration of FIG. 17, when the doping density in a region including the base end portion 202 of each columnar crystal 20A is increased simply in the same manner as in FIG. 15, MTF is deteriorated greatly because the crystallinity in the second half of crystal growth deteriorates conspicuously easily in the same manner as in FIG. 15. Therefore, when the doping density in the base end portion 202 of each columnar crystal is set at low density as in FIG. 6 or the like, the effect to suppress the disorder of crystallinity in the second half of crystal growth is great. In the configuration of FIG. 17, the effect to suppress the lowering of MTF is great in the same manner as in FIG. 16 because the distance between the photodetector 40 and the main luminescent region is long and MTF deteriorates easily due to light absorption.

[9. Available Device Material]

[9-1. OPC (Organic Photoelectric Conversion) Material]

For example, any OPC (Organic Photoelectric Conversion) material disclosed in JP-A-2009-32854 can be used for the aforementioned photoelectric conversion elements 41 (FIG. 2). A film formed out of the OPC material (hereinafter referred to as OPC film) can be used as the photoconductive layer 410 of the photoelectric conversion elements 41. The OPC film contains an organic photoelectric conversion material, which absorbs light emitted from the scintillator and generates electric charges corresponding to the absorbed light. Thus, the OPC film containing the organic photoelectric conversion material has a sharp absorption spectrum in a visible light range. Electromagnetic waves other than the light emitted by the scintillator are hardly absorbed by the OPC film. Thus, noise generated by radioactive rays such as X-rays absorbed by the OPC film can be suppressed effectively.

It is preferable that the absorption peak wavelength of the organic photoelectric conversion material forming the OPC film is closer to the peak wavelength of light emitted by the scintillator in order to more efficiently absorb the light emitted by the scintillator. Ideally, the absorption peak wavelength of the organic photoelectric conversion material agrees with the peak wavelength of the light emitted by the scintillator. However, if the difference between the absorption peak wavelength of the organic photoelectric conversion material and the peak wavelength of the light emitted by the scintillator is small, the light emitted by the scintillator can be absorbed satisfactorily. Specifically, the difference between the absorption peak wavelength of the organic photoelectric conversion material and the peak wavelength of the light emitted by the scintillator in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the scintillator material, the aforementioned difference in peak wavelength can be set within 5 nm so that the amount of electric charges generated in the OPC film can be increased substantially to the maximum.

At least a part of an organic layer provided between the bias electrode 411 and the charge collection electrode 412 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the scintillator. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[9-2. Organic TFT (Thin Film Transistor)]

Although inorganic materials are often used for the aforementioned TFT switching devices 42, organic materials may be used, for example, as disclosed in JP-A-2009-212389. Organic TFT may have any type of structure but a field effect transistor (FET) structure is the most preferable. In the FET structure, a substrate is disposed in the bottom layer, and a gate electrode is provided partially an upper surface of the substrate. An insulator layer is provided to cover the electrode and touch the substrate in the other portion than the electrode. Further, a semiconductor active layer is provided on an upper surface of the insulator layer, and a source electrode and a drain electrode are disposed partially on the upper surface of the semiconductor active layer and at a distance from each other. This configuration is called a top contact type device. A bottom contact type device in which a source electrode and a drain electrode are disposed under a semiconductor active layer may be also used preferably. In addition, a vertical transistor structure in which a carrier flows in the thickness direction of an organic semiconductor film may be used.

(Semiconductor Active Layer)

A p-type organic semiconductor material is used as the material of the semiconductor active layer. The p-type organic semiconductor material is substantially colorless and transparent. For example, the thickness of the organic semiconductor thin film may be measured by a stylus thickness meter. A plurality of thin films with different thicknesses may be manufactured and their absorption spectra may be measured so that the maximum absorbance per film thickness of 30 nm can be obtained by conversion based on a calibration curve.

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) μ which indicates the mobility of a carrier in an organic semiconductor layer. Although preferred mobility varies in accordance with applications, higher mobility is generally preferred. The mobility is preferably not lower than $1.0*10^{-7}$ cm$^2$/Vs, more preferably not lower than $1.0*10^{-6}$ cm$^2$/Vs, further preferably not lower than $1.0*10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

Preferred specific examples of such a p-type organic semiconductor material will be shown. Bu represents a butyl group, Pr represents a propyl group, Et represents an ethyl group, and Ph represents a phenyl group.

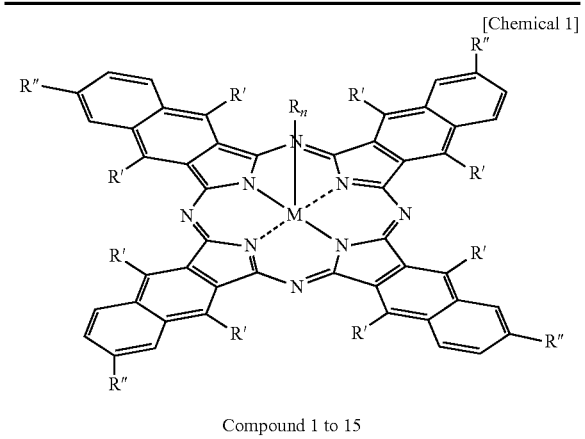

[Chemical 1]

Compound 1 to 15

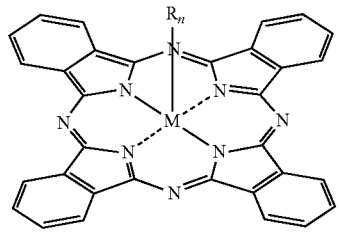

Compound 16 to 20

| Compound | M | R | n | R' | R" |
|---|---|---|---|---|---|
| 1 | Si | OSi(n-Bu)$_3$ | 2 | H | H |
| 2 | Si | OSi(i-Pr)$_3$ | 2 | H | H |
| 3 | Si | OSi(OEt)$_3$ | 2 | H | H |
| 4 | Si | OSiPh$_3$ | 2 | H | H |
| 5 | Si | O(n-C$_8$H$_{17}$) | 2 | H | H |
| 7 | Ge | OSi(n-Bu)$_3$ | 2 | H | H |
| 8 | Sn | OSi(n-Bu)$_3$ | 2 | H | H |
| 9 | Al | OSi(n-C$_6$H$_{13}$)$_3$ | 1 | H | H |
| 10 | Ga | OSi(n-C$_6$H$_{13}$)$_3$ | 1 | H | H |
| 11 | Cu | — | — | O(n-Bu) | H |
| 12 | Ni | — | — | O(n-Bu) | H |
| 13 | Zn | — | — | H | t-Bu |
| 14 | V=O | — | — | H | t-Bu |
| 15 | H$_2$ | — | — | H | t-Bu |
| 16 | Si | OSiEt$_3$ | 2 | — | — |
| 17 | Ge | OSiEt$_3$ | 2 | — | — |
| 18 | Sn | OSiEt$_3$ | 2 | — | — |
| 19 | Al | OSiEt$_3$ | 1 | — | — |
| 20 | Ga | OSiEt$_3$ | 1 | — | — |

(Device Constituent Materials Other than Semiconductor Active Layer)

Description will be made below on device constituent materials other than the semiconductor active layer in the organic thin film transistor. The visible-light or infrared-light transmittance of each of those materials is preferably not lower than 60%, more preferably not lower than 70%, further more preferably not lower than 80%.

The substrate is not limited particularly as long as it has required smoothness. Examples of the substrate include glass, quartz, light transmissive plastic film, etc. Examples of the light transmissive plastic film include films or the like, made from polyethylene terephthalate (PET), polyethylene naphthalate (PEN), polyether sulfone (PES), polyether imide, polyetheretherketone, polyphenylene sulfide, polyalylate, polyimide, polycarbonate (PC), cellulose triacetate (TAC), cellulose acetate propionate (CAP), etc. In addition, any organic or inorganic filler may be contained in these plastic films. A flexible substrate formed out of aramid, bionanofiber, or the like may be used preferably as the substrate.

The material forming the gate electrode, the source electrode or the drain electrode is not limited especially if it has required electric conductivity. Examples thereof include electrically conductive oxides such as ITO (indium-doped tin oxide), IZO (indium-doped zinc oxide), SnO$_2$, ATO (antimony-doped tin oxide), ZnO, AZO (aluminum-doped zinc oxide), GZO (gallium-doped zinc oxide), TiO$_2$, FTO (fluorine-doped tin oxide), etc., electrically conductive polymers such as PEDOT/PSS (poly(3,4-ethylenedioxythiophene)/polystyrenesulfonate), carbon materials such as carbon nanotube, etc. These electrode materials may be formed into films, for example, by a method such as a vacuum deposition method, sputtering, a solution application method, etc.

The material used for the insulating layer is not limited particularly as long as it has required insulating effect. Examples thereof include inorganic materials such as silicon dioxide, silicon nitride, alumina, etc., and organic materials such as polyester, (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a method such as a vacuum deposition method, sputtering, a solution application method, etc.

As for any other configuration about the aforementioned organic TFT, for example, refer to description in JP-A-2009-212389.

[9-3. Amorphous Oxide Semiconductor]

For example, amorphous oxide disclosed in JP-A-2010-186860 may be used for the aforementioned TFT switching devices 42. Here, description will be made on an amorphous oxide containing active layer of a FET transistor disclosed in JP-A-2010-186860. The active layer serves as a channel layer of the FET transistor where electrons or holes move.

The active layer has a configuration containing an amorphous oxide semiconductor. The amorphous oxide semiconductor can be formed into a film at a low temperature. Thus, the amorphous oxide semiconductor is formed preferably on a flexible substrate.

The amorphous oxide semiconductor used for the active layer is preferably amorphous oxide containing at least one kind of element selected from a group consisting of In, Sn, Zn and Cd, more preferably amorphous oxide containing at least one kind of element selected from a group consisting of In, Sn and Zn, further preferably amorphous oxide containing at least one kind of element selected from a group consisting of In and Zn.

Specific examples of the amorphous oxide used for the active layer include In$_2$O$_3$, ZnO, SnO$_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method for forming the active layer. Of vapor phase film formation methods, a sputtering method or a pulse laser deposition (PLD) method is preferred. Further, the sputtering method is preferred in view from mass productivity. For example, the active layer is formed by an RF magnetron sputtering deposition method with a controlled degree of vacuum and a controlled flow rate of oxygen.

The thus formed active layer is confirmed to be an amorphous film by a well-known X-ray diffraction method. The composition ratio of the active layer is obtained by an RBS (Rutherford Backscattering Spectrometry) method.

In addition, the electric conductivity of the active layer is preferably lower than $10^2$ Scm$^{-1}$ and not lower than $10^{-4}$ Scm$^{-1}$, more preferably lower than $10^2$ Scm$^{-1}$ and not lower than $10^{-1}$ Scm$^{-1}$. Examples of the method for adjusting the electric conductivity of the active layer include a known adjusting method using oxygen defect, an adjusting method using a composition ratio, an adjusting method using impurities, and an adjusting method using an oxide semiconductor material.

As for any other configuration about the aforementioned amorphous oxide, for example, refer to description in JP-A-2010-186860.

[9-4. Flexible Material]

It may be considered that aramid, bionanofiber, etc. having properties such as flexibility, low thermal expansion and high strength, which cannot be obtained in existing glass or plastic, are used in a radiological image detection apparatus.

(1) Aramid

A film (or a sheet or a substrate) formed out of aramid which is a flexible material may be used as the insulating substrate 401 of the aforementioned sensor board, the support 101, the circuit board of the control module, or the like. An aramid material has high heat resistance showing a glass transition temperature of 315° C., high rigidity showing a Young's modulus of 10 GPa, and high dimensional stability showing a thermal expansion coefficient of −3 to 5 ppm/° C. Therefore, when a film made from aramid is used, it is possible to easily form a high-quality film for a semiconductor layer or a scintillator, as compared with the case where a general resin film is used. In addition, due to the high heat resistance of the aramid material, a transparent electrode material can be cured at a high temperature to have low resistance. Further, it is also possible to deal with automatic mounting with ICs, including a solder reflow step. Furthermore, since the aramid material has a thermal expansion coefficient close to that of ITO (indium tin oxide), a gas barrier film or a glass substrate, warp after manufacturing is small. In addition, cracking hardly occurs. Here, it is preferable to use a halogen-free (in conformity with the requirements of JPCA-ES01-2003) aramid material containing no halogens, in view of reduction of environmental load.

The aramid film may be laminated with a glass substrate or a PET substrate, or may be pasted onto a housing of a device.

High intermolecular cohesion (hydrogen bonding force) of aramid leads to low solubility to a solvent. When the problem of the low solubility is solved by molecular design, an aramid material easily formed into a colorless and transparent thin film can be used preferably. Due to molecular design for controlling the order of monomer units and the substituent species and position on an aromatic ring, easy formation with good solubility can be obtained with the molecular structure kept in a bar-like shape with high linearity leading to high rigidity or dimensional stability of the aramid material. Due to the molecular design, halogen-free can be also achieved.

In addition, an aramid material having an optimized characteristic in an in-plane direction of a film can be used preferably. Tensional conditions are controlled in each step of solution casting, vertical drawing and horizontal drawing in accordance with the strength of the aramid film which varies constantly during casting. Due to the control of the tensional conditions, the in-plane characteristic of the aramid film which has a bar-like molecular structure with high linearity leading to easy occurrence of anisotropic physicality can be balanced.

Specifically, in the solution casting step, the drying rate of the solvent is controlled to make the in-plane thickness-direction physicality isotropic and optimize the strength of the film including the solvent and the peel strength from a casting drum. In the vertical drawing step, the drawing conditions are controlled precisely in accordance with the film strength varying constantly during drawing and the residual amount of the solvent. In the horizontal drawing, the horizontal drawing conditions are controlled in accordance with a change in film strength varying due to heating and controlled to relax the residual stress of the film. By use of such an aramid material, the problem that the aramid film after casting may be curled.

In each of the contrivance for the easiness of casting and the contrivance for the balance of the film in-plane characteristic, the bar-like molecular structure with high linearity peculiar to aramid can be kept to keep the thermal expansion coefficient low. When the drawing conditions during film formation are changed, the thermal expansion coefficient can be reduced further.

(2) Bionanofiber

Components sufficiently small relative to the wavelength of light produce no scattering of the light. Accordingly, a flexible plastic material, or the like, reinforced by nanofibers may be used preferably in the insulating substrate 401 of the aforementioned sensor board, the support 101, the circuit board of the control module, or the like. Of the nanofibers, a composite material (occasionally referred to as bionanofiber) of bacterial cellulose and transparent resin can be used preferably. The bacterial cellulose is produced by bacteria (Acetobacter Xylinum). The bacterial cellulose has a cellulose microfibril bundle width of 50 nm, which is about ¹⁄₁₀ as large as the wavelength of visible light. In addition, the bacterial cellulose is characterized by high strength, high elasticity and low thermal expansion.

When a bacterial cellulose sheet is impregnated with transparent resin such as acrylic resin or epoxy resin and hardened, transparent bionanofiber showing a light transmittance of about 90% in a wavelength of 500 nm while having a high fiber ratio of about 60 to 70% can be obtained. By the bionanofiber, a thermal expansion coefficient (about 3 to 7 ppm) as low as that of silicon crystal, strength (about 460 MPa) as high as that of steel, and high elasticity (about 30 GPa) can be obtained.

As for the configuration about the aforementioned bionanofiber, for example, refer to description in JP-A-2008-34556.

[8. Disclosure of Specification]

It is disclosed a radiological image detection apparatus includes: a scintillator which is formed out of a group of columnar crystals in which crystals of a fluorescent material emitting fluorescence when irradiated with radiation have grown into columnar shapes; and a photodetector which detects the fluorescence emitted by the scintillator as an electric signal. Activator density in the scintillator varies between high density and low density repeatedly in a radiation travelling direction in at least a part of the scintillator. The activator density in each of front end portions and base end portions of the columnar crystals is lower than the high density.

In the radiological image detection apparatus, the activator density may vary between the high density and the low density repeatedly in a region including at least a radiation entrance side portion in the scintillator.

In the radiological image detection apparatus, the scintillator and the photodetector may be pasted onto each other.

In the radiological image detection apparatus, the scintillator may be formed to include non-columnar crystals provided at front ends of the columnar crystals.

In the radiological image detection apparatus, activator density in the non-columnar portion may be lower than the high density.

In the radiological image detection apparatus, a void ratio of the non-columnar portion may be zero or substantially zero.

In the radiological image detection apparatus, radiation may be incident on the scintillator through the photodetector.

In the radiological image detection apparatus, activator density in a portion on an opposite side to a radiation entrance side in the scintillator may vary repeatedly between middle density lying between the high density and the low density, and the low density.

In the radiological image detection apparatus, activator density in a portion on an opposite side to a radiation entrance side in the scintillator may decrease gradually in a radiation travelling direction.

In the radiological image detection apparatus, the activator density may vary repeatedly between the high density and the low density while at least the high density of the high density and the low density decreases gradually in a radiation travelling direction.

In the radiological image detection apparatus, the activator density may vary like pulses between the high density and the low density; and an interval between the pulses on an opposite side to a radiation entrance side may be wider than an interval between the pulses on the radiation entrance side.

In the radiological image detection apparatus, a host of the fluorescent material may be CsI, and an activator may be Tl.

In the radiological image detection apparatus, the radiological image detection apparatus may be formed into a portable cassette.

Also, it is disclosed a method for manufacturing the aforementioned radiological image detection apparatus, includes: forming the scantillator by a vapor deposition method with changing at least one of conditions of activator heating temperature, vacuum degree, substrate temperature and deposition rate.

What is claimed is:

1. A radiological image detection apparatus comprising:
   a scintillator which is formed out of a group of columnar crystals in which crystals of a fluorescent material emitting fluorescence when irradiated with radiation have grown into columnar shapes; and
   a photodetector which detects the fluorescence emitted by the scintillator as an electric signal; wherein:
   activator density in the scintillator varies between high density and low density repeatedly in a radiation travelling direction in at least a part of the scintillator; and
   the activator density in each of front end portions and base end portions of the columnar crystals is lower than the high density.

2. The radiological image detection apparatus according to claim 1, wherein:
   the activator density varies between the high density and the low density repeatedly in a region including at least a radiation entrance side portion in the scintillator.

3. The radiological image detection apparatus according to claim 1, wherein:
   the scintillator and the photodetector are pasted onto each other.

4. The radiological image detection apparatus according to claim 1, wherein:
   the scintillator is formed to include non-columnar crystals provided at front ends of the columnar crystals.

5. The radiological image detection apparatus according to claim 4, wherein:
   activator density in the non-columnar portion is lower than the high density.

6. The radiological image detection apparatus according to claim 4, wherein:
   a void ratio of the non-columnar portion is zero or substantially zero.

7. The radiological image detection apparatus according to claim 1, wherein:
   radiation is incident on the scintillator through the photodetector.

8. The radiological image detection apparatus according to claim 1, wherein:
   activator density in a portion on an opposite side to a radiation entrance side in the scintillator varies repeatedly between middle density lying between the high density and the low density, and the low density.

9. The radiological image detection apparatus according to claim 1, wherein:
   activator density in a portion on an opposite side to a radiation entrance side in the scintillator decreases gradually in a radiation travelling direction.

10. The radiological image detection apparatus according to claim 1, wherein:
    the activator density varies repeatedly between the high density and the low density while at least the high density of the high density and the low density decreases gradually in a radiation travelling direction.

11. The radiological image detection apparatus according to claim 1, wherein:
    the activator density varies like pulses between the high density and the low density; and
    an interval between the pulses on an opposite side to a radiation entrance side is wider than an interval between the pulses on the radiation entrance side.

12. The radiological image detection apparatus according to claim 1, wherein:
    a host of the fluorescent material is CsI, and an activator is Tl.

13. The radiological image detection apparatus according to claim 1, wherein:
    the radiological image detection apparatus is formed into a portable cassette.

14. The radiological image detection apparatus according to claim 4, wherein:
    radiation is incident on the scintillator through the photodetector.

15. The radiological image detection apparatus according to claim 14, wherein:
    activator density in a portion on an opposite side to a radiation entrance side in the scintillator varies repeatedly between middle density lying between the high density and the low density, and the low density.

16. The radiological image detection apparatus according to claim 15, wherein:
    activator density in a portion on an opposite side to a radiation entrance side in the scintillator decreases gradually in a radiation travelling direction.

17. The radiological image detection apparatus according to claim 16, wherein:
    the activator density varies repeatedly between the high density and the low density while at least the high density of the high density and the low density decreases gradually in a radiation travelling direction.

18. The radiological image detection apparatus according to claim 17, wherein:
the activator density varies like pulses between the high density and the low density; and
an interval between the pulses on an opposite side to a radiation entrance side is wider than an interval between the pulses on the radiation entrance side.

19. The radiological image detection apparatus according to claim 18, wherein:
a host of the fluorescent material is CsI, and an activator is Tl.

20. A method for manufacturing the radiological image detection apparatus according to claim 1, comprising:
forming the scantillator by a vapor deposition method with changing at least one of conditions of activator heating temperature, vacuum degree, substrate temperature and deposition rate.

* * * * *